United States Patent
Hagishima et al.

(10) Patent No.: US 11,610,910 B2
(45) Date of Patent: Mar. 21, 2023

(54) SEMICONDUCTOR MEMORY DEVICE

(71) Applicant: Kioxia Corporation, Tokyo (JP)

(72) Inventors: Daisuke Hagishima, Tokyo (JP); Fumitaka Arai, Yokkaichi (JP); Keiji Hosotani, Yokkaichi (JP); Masaki Kondo, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 194 days.

(21) Appl. No.: 17/016,909

(22) Filed: Sep. 10, 2020

(65) Prior Publication Data

US 2021/0296337 A1    Sep. 23, 2021

(30) Foreign Application Priority Data

Mar. 23, 2020 (JP) .............................. JP2020-050773

(51) Int. Cl.
| | |
|---|---|
| *H01L 27/11582* | (2017.01) |
| *H01L 27/11556* | (2017.01) |
| *H01L 27/11519* | (2017.01) |
| *H01L 27/11565* | (2017.01) |
| G11C 16/04 | (2006.01) |

(52) U.S. Cl.
CPC .. *H01L 27/11556* (2013.01); *H01L 27/11519* (2013.01); *H01L 27/11565* (2013.01); *H01L 27/11582* (2013.01); *G11C 16/0483* (2013.01)

(58) Field of Classification Search
CPC ............................................... H01L 27/11582
See application file for complete search history.

(56) References Cited

U.S. PATENT DOCUMENTS

| | | | |
|---|---|---|---|
| 7,382,018 B2 | 6/2008 | Kim et al. | |
| 7,662,720 B2 | 2/2010 | Kim et al. | |
| 9,293,470 B2 | 3/2016 | Sakuma et al. | |
| 9,589,979 B2 | 3/2017 | Hong | |
| 9,922,990 B2 | 3/2018 | Song | |
| 10,056,433 B2 | 8/2018 | Kiyotoshi et al. | |
| 2015/0221368 A1 | 8/2015 | Kanno et al. | |
| 2016/0358932 A1 | 12/2016 | Yang | |
| 2020/0273501 A1* | 8/2020 | Yun .................... | H01L 23/5226 |

FOREIGN PATENT DOCUMENTS

| | | |
|---|---|---|
| JP | 2008-78404 A | 4/2008 |
| TW | 201535374 A | 9/2015 |

* cited by examiner

*Primary Examiner* — Christopher A Johnson
(74) *Attorney, Agent, or Firm* — Oblon, McClelland, Maier & Neustadt, L.L.P.

(57) ABSTRACT

According to one embodiment, a semiconductor memory device includes first and second semiconductor layers and a first conductive layer. The first and second semiconductor layers extend in a first direction. The second semiconductor layer is stacked above the first semiconductor layer in a second direction intersecting the first direction. The first conductive layer intersects the first and second semiconductor layers and extends in the second direction. The first conductive layer includes first and second portions intersecting the first and second semiconductor layers respectively. A width of the first portion in the first direction is smaller than a width of the second portion in the first direction. A thickness of the first semiconductor layer in the second direction is larger than a thickness of the second semiconductor layer in the second direction.

18 Claims, 34 Drawing Sheets

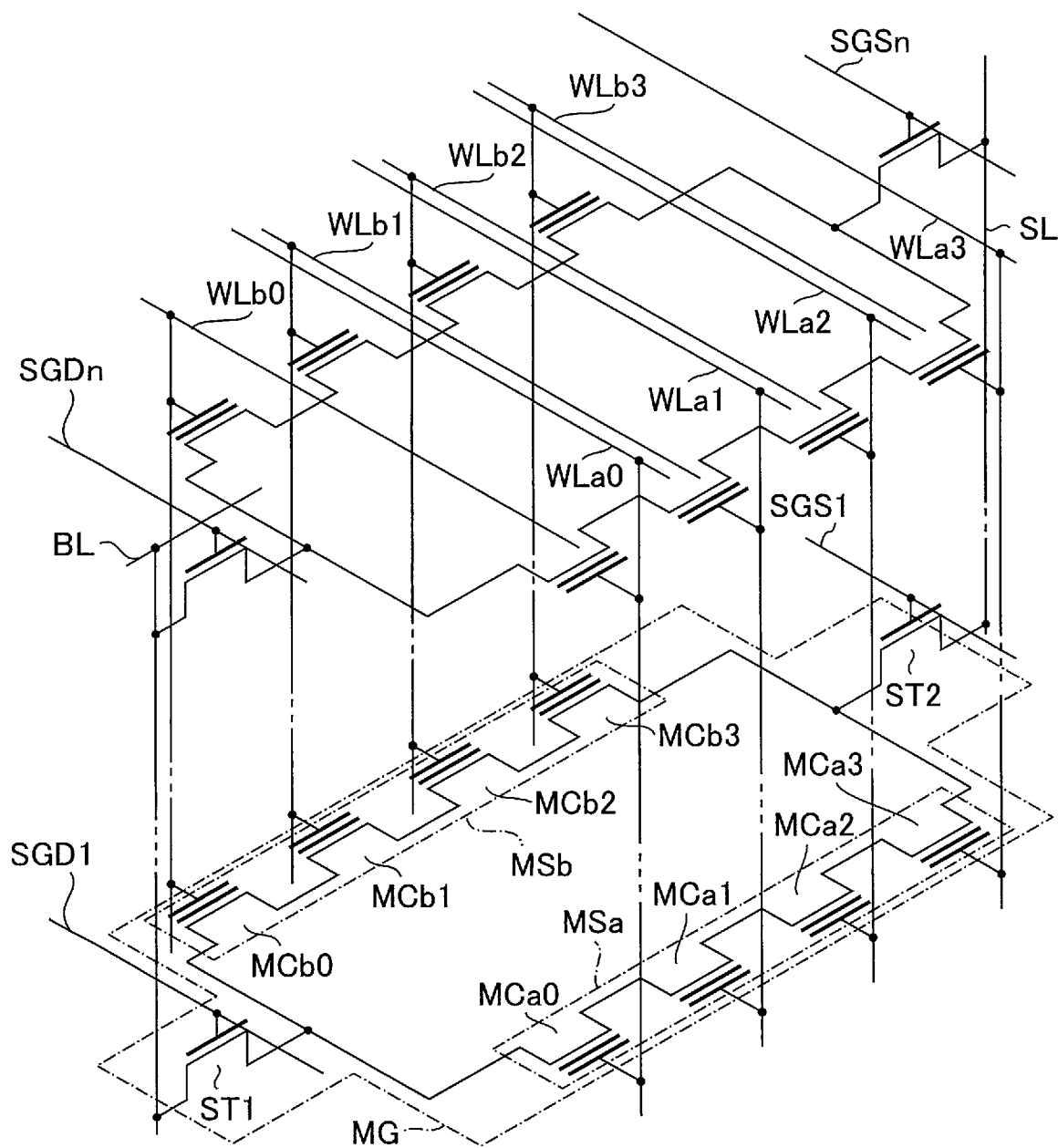
F I G. 3

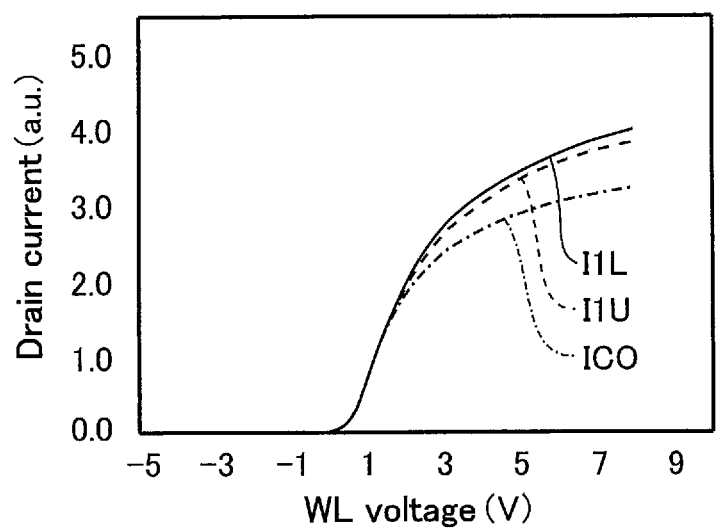
F I G. 16

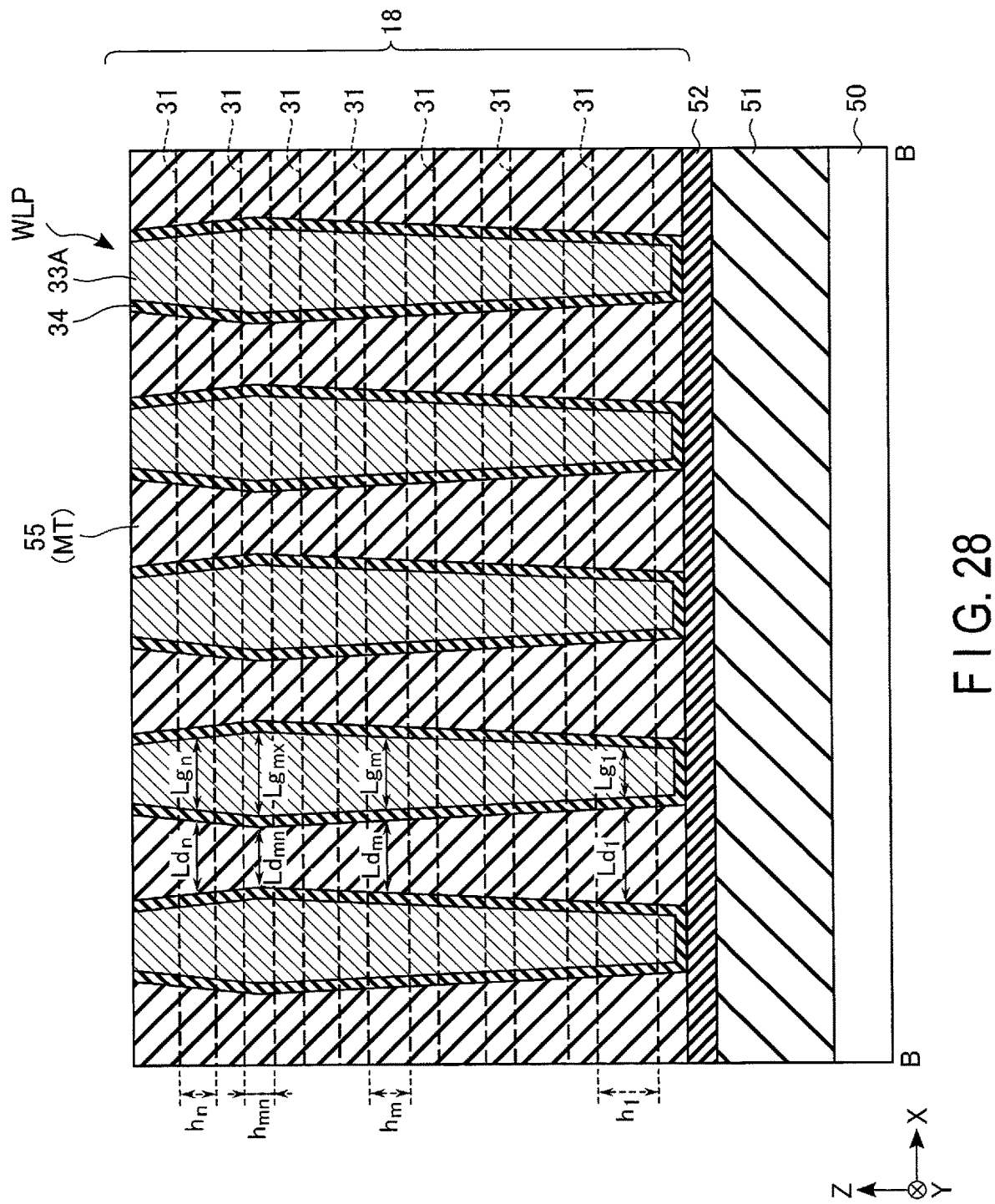
F I G. 28

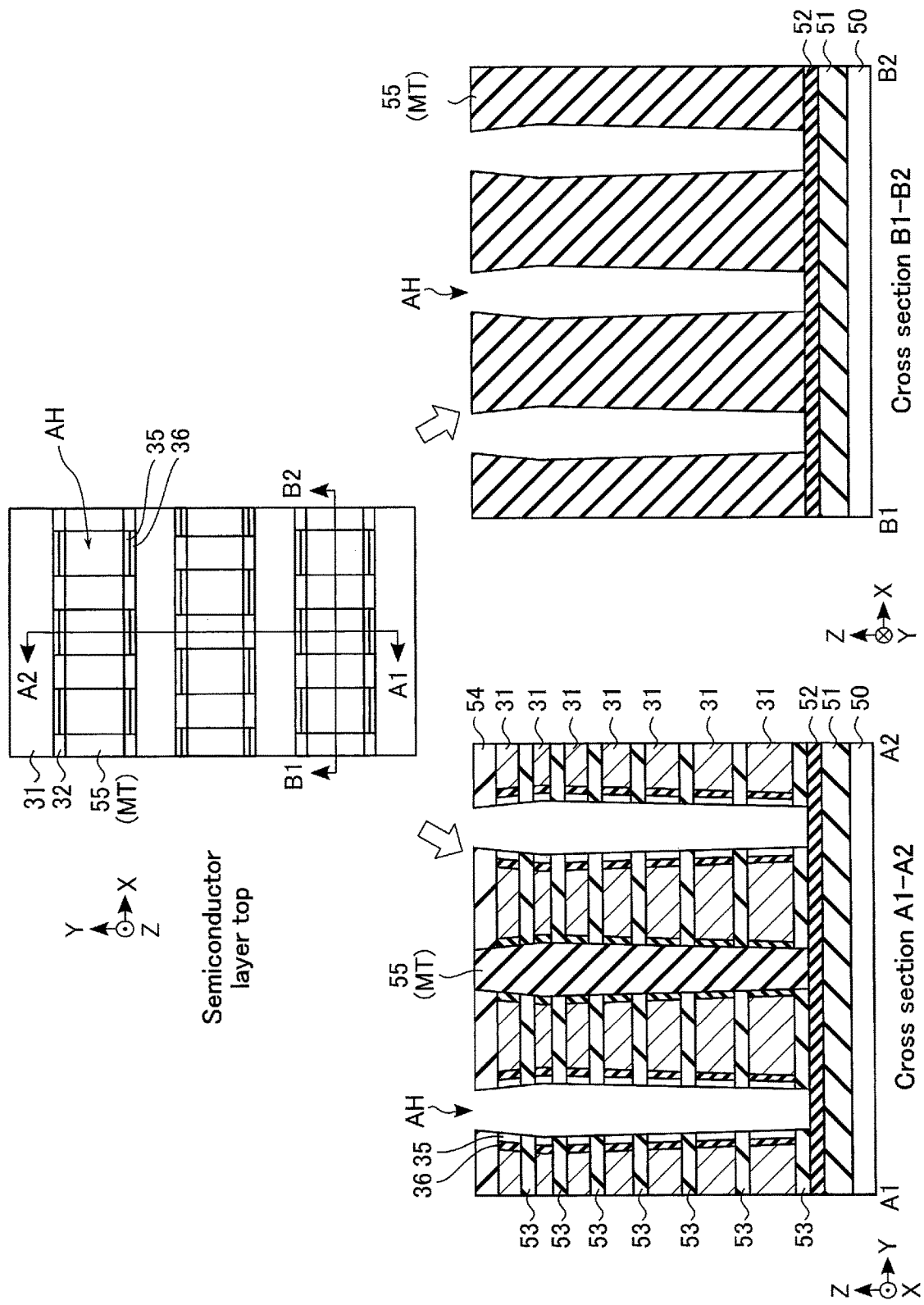
F I G. 33

US 11,610,910 B2

SEMICONDUCTOR MEMORY DEVICE

CROSS-REFERENCE TO RELATED APPLICATIONS

This application is based upon and claims the benefit of priority from the Japanese Patent Application No. 2020-050773, filed Mar. 23, 2020, the entire contents of which are incorporated herein by reference.

FIELD

Embodiments described herein relate generally to a semiconductor memory device.

BACKGROUND

A semiconductor memory device in which memory cells are three-dimensionally arranged is known.

BRIEF DESCRIPTION OF THE DRAWINGS

FIG. 3 is a circuit diagram of the memory cell array in the first embodiment.

FIG. 16 is a diagram showing voltage-current characteristics of memory cell transistors in the first embodiment and a comparative example.

FIG. 28 is a cross-sectional view of the memory cell region in the fourth embodiment, taken along line B-B.

FIGS. 29 to 34 are diagrams showing a method for manufacturing the memory cell region in the fourth embodiment.

DETAILED DESCRIPTION

In general, according to one embodiment, a semiconductor memory device comprises: a first semiconductor layer extending in a first direction; a second semiconductor layer stacked above the first semiconductor layer in a second direction intersecting the first direction, the second semiconductor layer extending in the first direction; and a first conductive layer intersecting the first semiconductor layer and the second semiconductor layer and extending in the second direction, wherein the first conductive layer includes a first portion intersecting the first semiconductor layer and a second portion intersecting the second semiconductor layer, a first width of the first portion in the first direction is smaller than a second width of the second portion in the first direction, and a first thickness of the first semiconductor layer in the second direction is larger than a second thickness of the second semiconductor layer in the second direction.

Hereinafter, embodiments will be described with reference to the accompanying drawings. In the description below, constituent elements having substantially the same function and configuration will be assigned a common reference symbol. Each of the embodiments described below merely indicates an exemplary apparatus or method for embodying the technical idea of the embodiment. The material, shape, structure, arrangement, etc. of the technical idea of each embodiment are not limited to the ones described below. The technical ideas of the embodiments may be variously modified within the range of the claims. Hereinafter, a three-dimensionally stacked type NAND flash memory, in which memory cell transistors are three-dimensionally stacked above a semiconductor substrate, will be described as an example of the semiconductor memory device of each embodiment.

1. First Embodiment

A semiconductor memory device according to a first embodiment will be described.

1.1 Configuration of Semiconductor Memory Device

1.1.1 Circuit Configuration of Semiconductor Memory Device

Figure 1:
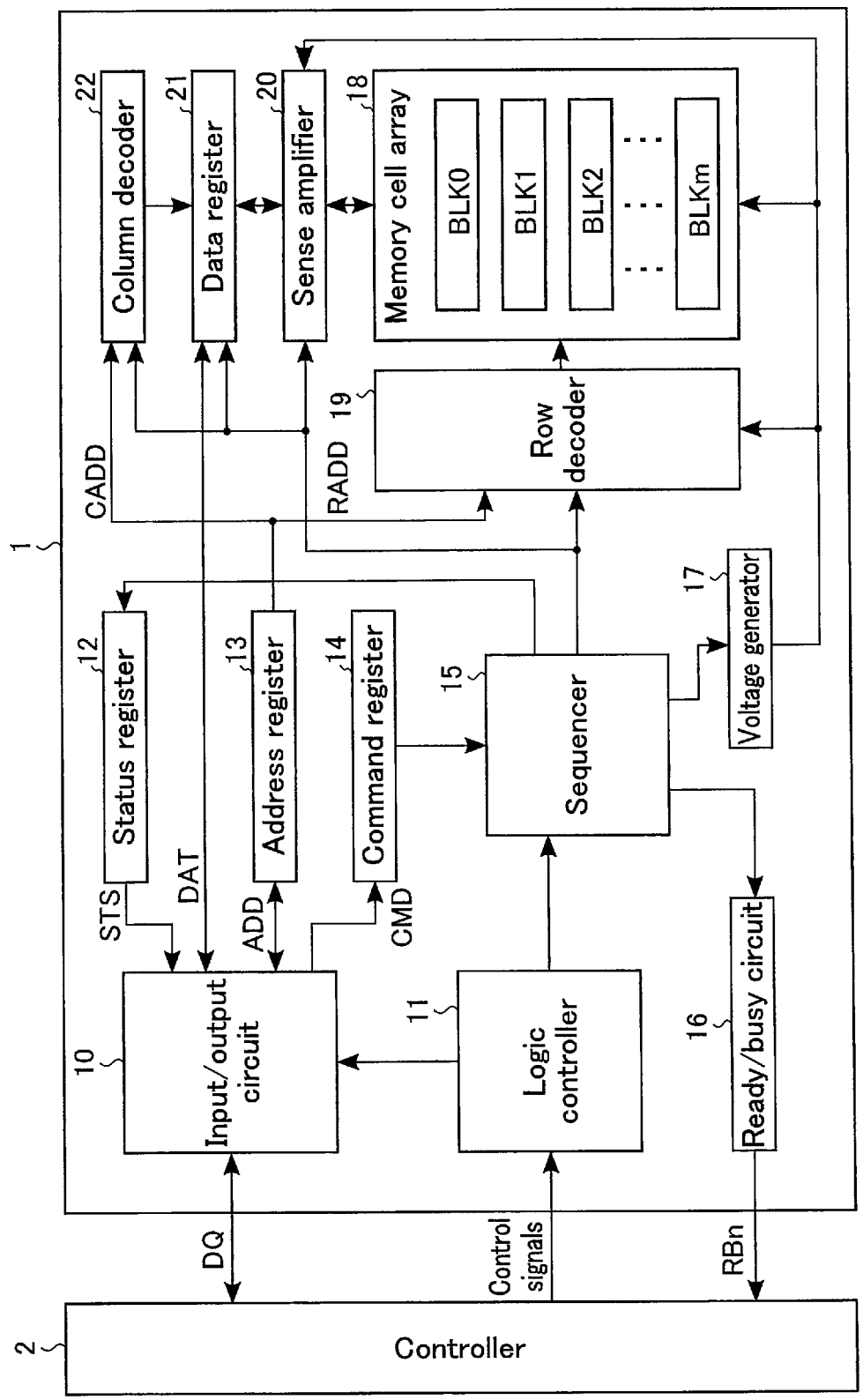
FIG. 1 is a block diagram showing a circuit configuration of a semiconductor memory device according to a first embodiment.

First, a circuit configuration of the semiconductor memory device will be described with reference to FIG. 1. FIG. 1 is a block diagram showing an example of the circuit configuration of the semiconductor memory device. In FIG. 1, some of the couplings between the blocks are indicated by arrows; however, the couplings between the blocks are not limited to those shown in FIG. 1.

As shown in FIG. 1, the semiconductor memory device 1 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls input and output of a signal DQ to and from an external controller 2. The signal DQ includes, for example, data DAT, an address ADD, and a command CMD. Specifically, the input/output circuit 10 transmits the data DAT, address ADD, and command CMD received from the controller 2 to the data register 21, address register 13, and command register 14, respectively. The input/output circuit 10 also transmits status information STS received from the status register 12, the data DAT received from the data register 21, the address ADD received from the address register 13, and the like to the controller 2.

The logic controller 11 receives various control signals from the controller 2. The logic controller 11 controls the input/output circuit 10 and the sequencer 15 in accordance with the received control signals.

The status register 12 temporarily stores, for example, status information STS in a write operation, a read operation, or an erase operation, and notifies the controller 2 whether or not the operation has been normally completed.

The address register 13 temporarily stores the received address ADD. The address ADD includes a row address RADD and a column address CADD. The address register 13 transfers the row address RADD to the row decoder 19, and transfers the column address CADD to the column decoder 22.

The command register 14 temporarily stores the received command CMD, and transfers it to the sequencer 15.

The sequencer 15 controls the overall operation of the semiconductor memory device 1. Specifically, in accordance with the received command CMD, the sequencer 15 controls, for example, the status register 12, the ready/busy circuit 16, the voltage generator 17, the row decoder 19, the sense amplifier 20, the data register 21, the column decoder 22, and the like to execute a write operation, a read operation, an erase operation, and the like.

The ready/busy circuit 16 transmits a ready/busy signal RBn to the controller 2 in accordance with the operation status of the sequencer 15.

The voltage generator 17 generates various voltages used in a write operation, a read operation, and an erase operation under control of the sequencer 15, and supplies the generated voltages to, for example, the memory cell array 18, the row decoder 19, the sense amplifier 20, and the like. The row decoder 19 and the sense amplifier 20 apply the voltages supplied from the voltage generator 17 to memory cell transistors in the memory cell array 18.

The memory cell array 18 includes a plurality of blocks BLK0, BLK1, BLK2, . . . , and BLKm (where m is an integer larger than or equal to 1), each including a plurality of nonvolatile memory cell transistors (hereinafter also referred to as "memory cells") each associated with a row and a column. Hereinafter, when the blocks BLK0 to BLKm are not distinguished from one another, each block will be referred to as a block BLK.

Each block BLK includes a plurality of memory units MU. Each memory unit MU includes a plurality of memory groups MG. The number of blocks BLK in the memory cell array 18, the number of memory units MU in each block BLK, and the number of memory groups MG in each memory unit MU may be any number. The memory cell array 18 will be described in detail later.

The row decoder 19 decodes the row address RADD. Based on a result of the decoding, the row decoder 19 applies a control voltage supplied from the voltage generator 17 to transistors in the memory cell array 18.

In a read operation, the sense amplifier 20 senses data read from the memory cell array 18. The sense amplifier 20 transmits the read data to the data register 21. In a write operation, the sense amplifier 20 transmits write data to the memory cell array 18.

The data register 21 includes a plurality of latch circuits. The latch circuits each temporarily store write data or read data.

In a write operation, a read operation, an erase operation, and the like, the column decoder 22 decodes the column address CADD, and selects a latch circuit in the data register 21 based on a result of the decoding.

1.1.2 Overall Configuration of Memory Cell Array

Figure 2:
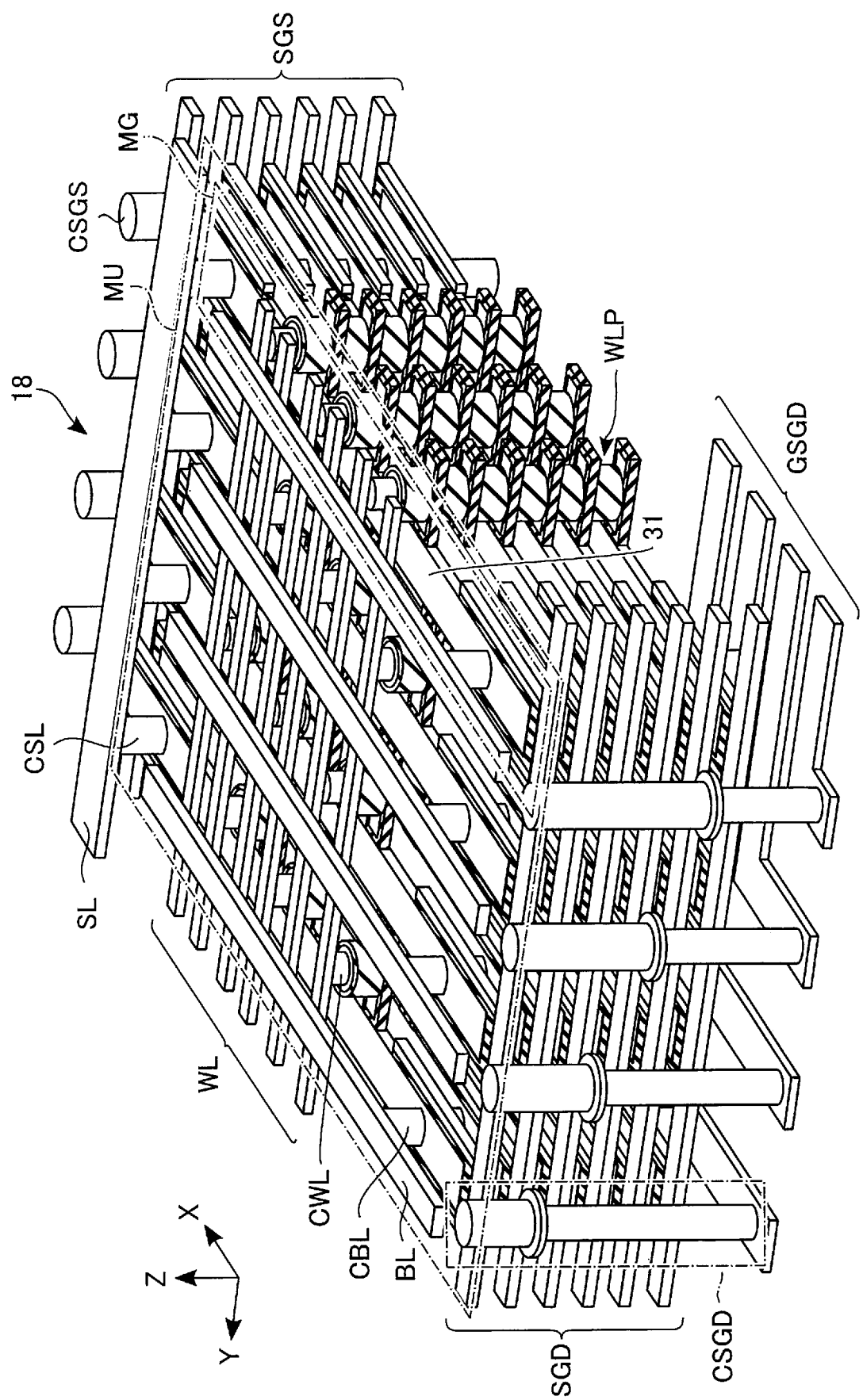
FIG. 2 is a perspective view of a memory cell array in the first embodiment.

Next, an overall configuration of the memory cell array 18 will be described with reference to FIG. 2. FIG. 2 is a perspective view of the memory cell array 18. In the example of FIG. 2, insulating layers between conductive layers are partly omitted.

As shown in FIG. 2, the memory cell array 18 includes a plurality of semiconductor layers 31, a plurality of word line pillars WLP, a plurality of word lines WL, a plurality of select gate lines SGD and SGS, a plurality of contact plugs CSGD and CSGS, a plurality of global select gate lines GSGD and GSGS (not shown), a plurality of contact plugs CBL, a plurality of bit lines BL, a plurality of contact plugs CSL, and a source line SL.

Each of the semiconductor layers 31 corresponds to one memory group MG to be described later, and functions as an active area in which channel layers of a plurality of memory cell transistors MC and select transistors ST1 and ST2 are formed. The semiconductor layers 31 extend in the X direction, which is parallel to the semiconductor substrate, and are stacked in the Z direction, which is perpendicular to the semiconductor substrate, apart from one another (with insulating layers (not shown) interposed therebetween). Sets of the semiconductor layers 31 stacked in the Z direction are aligned in the Y direction, which is parallel to the semiconductor substrate and is orthogonal to (or intersects) the X direction.

Between the sets of the semiconductor layers 31 aligned in the Y direction, a plurality of word line pillars WLP extending in the Z direction are aligned in the X direction. In other words, a set of the word line pillars WLP aligned in the X direction and a set of the semiconductor layers 31 stacked in the Z direction are alternately aligned in the Y direction. Word lines WL extending in the Y direction are provided above the word line pillars WLP. Each of the word line pillars WLP includes a contact plug CWL (hereinafter also referred to as an "interconnect CWL") electrically coupled to a word line WL provided above the contact plug CWL, and a block insulating layer provided in the side surfaces of the word line pillar WLP. In the layer at the same level as each of the semiconductor layers 31 from the semiconductor substrate, a charge storage layer and a tunnel insulating layer are provided between each word line pillar WLP and the semiconductor layer 31.

One memory cell transistor MC is provided at the intersection of one word line pillar WLP and semiconductor layer 31. Accordingly, a plurality of memory cell transistors MC are coupled in the X direction via a semiconductor layer 31. In other words, the channels of the memory cell transistors MC are coupled in the X direction.

A contact plug CBL is provided in the vicinity of one X-directional end of each set of the semiconductor layers 31 stacked in the Z direction. The contact plug CBL passes through the semiconductor layers 31 stacked in the Z direction, and is coupled to those semiconductor layers 31. A plurality of contact plugs CBL are provided in correspondence with the sets of the semiconductor layers 31 aligned in the Y direction. A bit line BL extending in the X direction is provided above each contact plug CBL. The contact plugs CBL are coupled to different bit lines BL.

A contact plug CSL is provided in the vicinity of the other X-directional end of each set of the semiconductor layers 31 stacked in the Z direction. The contact plug CSL passes through the semiconductor layers 31 stacked in the Z direction, and is coupled to those semiconductor layers 31. A plurality of contact plugs CSL are provided in correspondence with the sets of the semiconductor layers 31 aligned in the Y direction. A source line SL extending in the Y direction is provided above the contact plugs CSL. The contact plugs CSL are coupled in common to the source line SL.

One X-directional end each of the ends of the semiconductor layers 31 aligned in the Y direction in each layer is in contact with one of different insulating layers which are in contact with a select gate line SGD extending in the Y direction. Accordingly, the semiconductor layers 31 are not electrically coupled to the select gate line SGD. Similarly, the other X-directional ends of the semiconductor layers 31 aligned in the Y direction in each layer are in contact with different insulating layers which are in contact with a select gate line SGS extending in the Y direction. Accordingly, the semiconductor layers 31 are not electrically coupled to the select gate line SGS. The select gate lines SGD and SGS are stacked in such a manner that one select gate line SGD and one select gate line SGS are arranged in the same layer as each of the semiconductor layers 31 stacked in the Z direction.

Below the select gate lines SGD, a plurality of global select gate lines GSGD are formed on the X-Y plane.

On each of the global select gate lines GSGD, a contact plug CSGD extending in the Z direction is provided. The contact plugs CSGD are aligned in the Y direction. Each of the contact plugs CSGD includes a coupling portion which is electrically coupled to one of the select gate lines SGD. Namely, each contact plug CSGD electrically couples a global select gate line GSGD and a select gate line SGD. In the example of FIG. 2, the coupling portions of the contact plugs CSGD aligned in the Y direction are coupled to the select gate lines SGD in the respective layers in order, and are arranged like steps.

Below the select gate lines SGS, a plurality of global select gate lines GSGS (not shown) are formed on the X-Y plane.

On each of the global select gate lines GSGS, a contact plug CSGS extending in the Z direction is provided. The contact plugs CSGS are aligned in the Y direction. Each of the contact plugs CSGS includes a coupling portion which is electrically coupled to one of the select gate lines SGS. Namely, each contact plug CSGS electrically couples a global select gate line GSGS and a select gate line SGS.

A plurality of memory groups MG (semiconductor layers 31) aligned in the Y direction and corresponding to one select gate line SGD and one select gate line SGS are included in one memory unit MU. Furthermore, a plurality of memory units MU coupled in common to a word line pillar WLP are included in one block. BLK.

1.1.3 Circuit Configuration of Memory Cell Array

Figure 4:
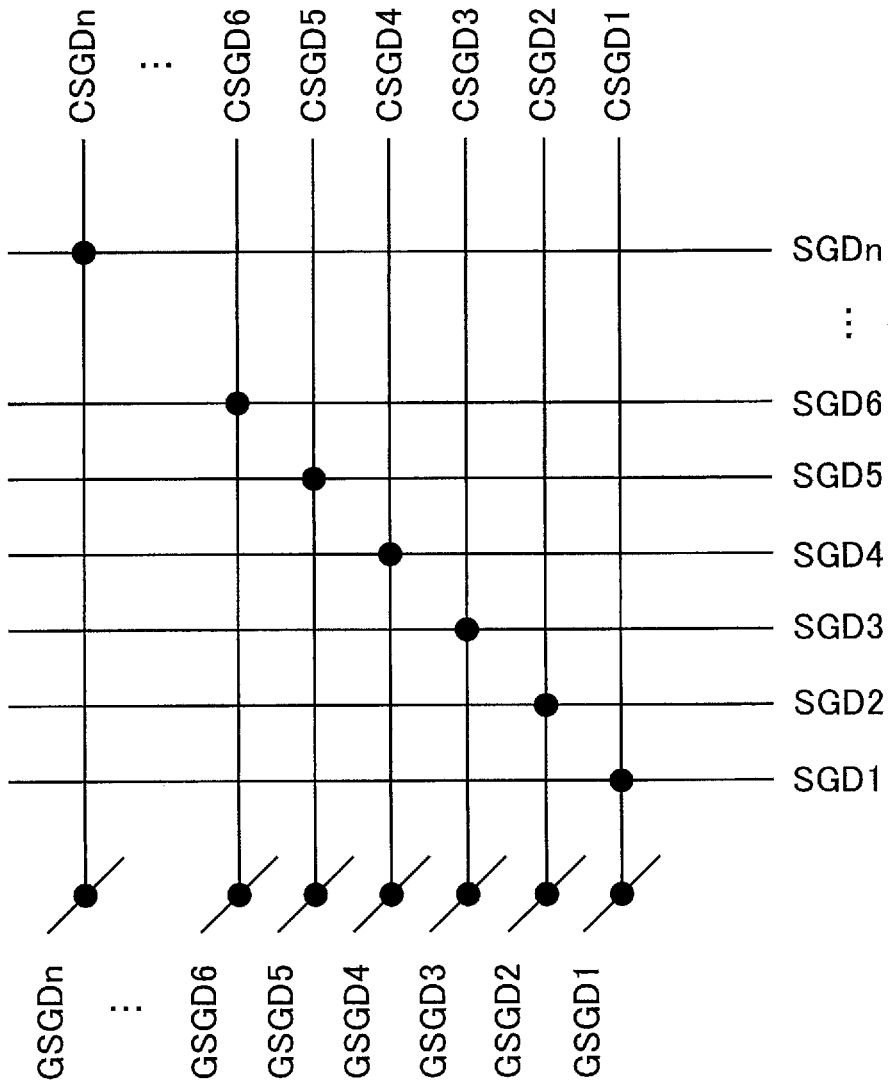
FIGS. 4 and 5 are circuit diagrams showing couplings between select gate lines and global select gate lines in the memory cell array.
Figure 5:
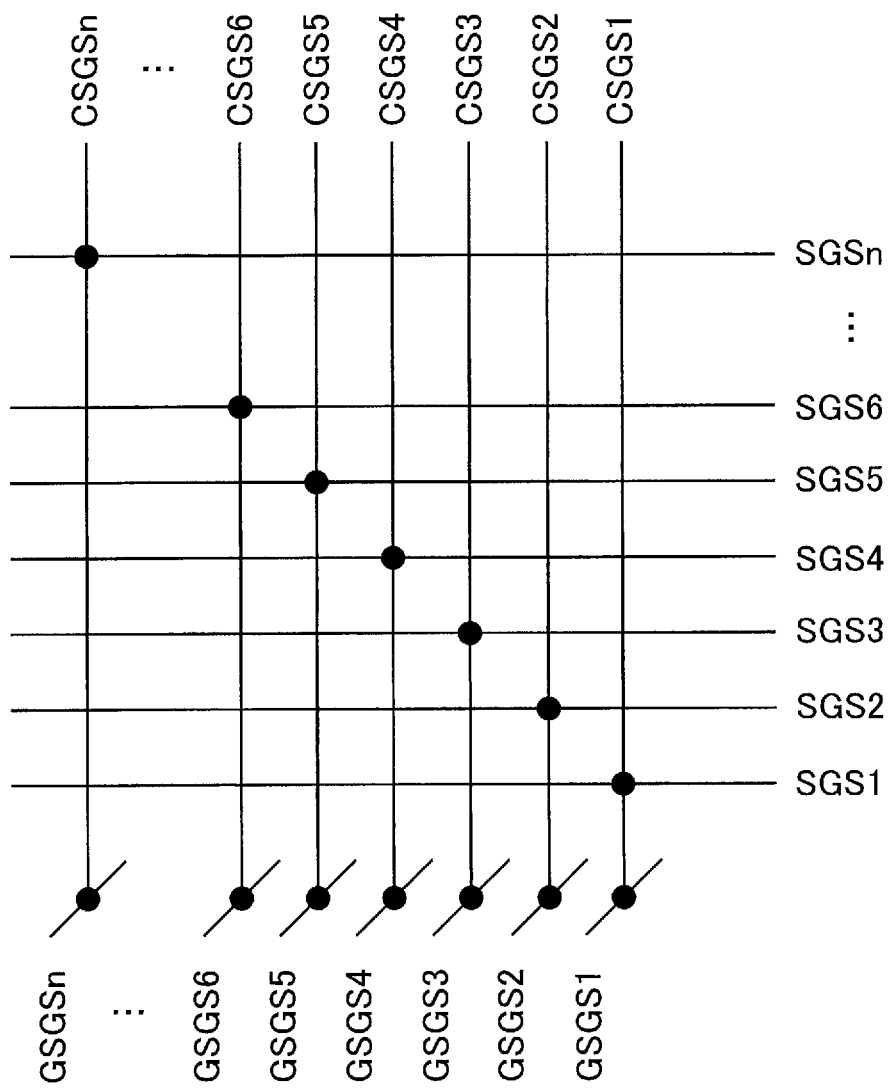

Next, a circuit configuration of the memory cell array 18 will be described with reference to FIGS. 3 to 5. FIG. 3 is a circuit diagram of the memory cell array 18. FIG. 4 is a circuit diagram showing couplings between the select gate lines SGD and the global select gate lines GSGD. FIG. 5 is a circuit diagram showing couplings between the select gate lines SGS and the global select gate lines GSGS. Shown in FIG. 3 as an example are a plurality of memory groups MG corresponding respectively to a plurality of semiconductor layers 31 stacked in the Z direction and coupled in common to one contact plug CBL. Shown in FIG. 4 as an example are contact plugs CSGD and global select gate lines GSGD coupled to the respective select gate lines SGD stacked in the Z direction. Shown in FIG. 5 as an example are contact plugs CSGS and global select gate lines GSGS coupled to the respective select gate lines SGS stacked in the Z direction. Hereinafter, the select gate lines corresponding to the lowermost semiconductor layers 31 (memory groups MG) will be respectively referred to as "SGD1" and "SGS1", and the select gate lines corresponding to the uppermost semiconductor layers 31 (memory groups MG) will be respectively referred to as "SGDn" and "SGSn" (where n is an integer larger than or equal to 2).

As shown in FIG. 3, the memory cell array 18 includes a plurality of memory groups MG. Each memory group MG includes two memory strings MSa and MSb, and select transistors ST1 and ST2. Hereinafter, the memory strings MSa and MSb will each be referred to as a memory string MS when they are not distinguished from each other.

The memory string MSa includes, for example, four memory cell transistors MCa0 to MCa3. Similarly, the memory string MSb includes, for example, four memory cell transistors MCb0 to MCb3. Hereinafter, the memory cell transistors MCa0 to MCa3 and MCb0 to MCb3 will each be referred to as a memory cell transistor MC when they are not distinguished from one another.

Each memory cell transistor MC includes a control gate and a charge storage layer, and nonvolatilely stores data. The memory cell transistor MC may be of a floating gate (FG) type which uses a conductive layer as the charge storage layer, or of a metal-oxide-nitride-oxide-silicon (MONOS) type which uses an insulating layer as the charge storage layer. The number of memory cell transistors MC included in each memory string MS may be 8, 16, 32, 48, 64, 96, 128, etc., and is not limited to a particular number.

The current paths of the memory cell transistors MCa0 to MCa3 included in the memory string MSa are coupled in series. Similarly, the current paths of the memory cell transistors MCb0 to MCb3 included in the memory string MSb are coupled in series. The drains of the memory cell transistors MCa0 and MCb0 are coupled in common to the source of the select transistor ST1. The sources of the memory cell transistors MCa3 and MCb3 are coupled in common to the drain of the select transistor ST2. The numbers of select transistors ST1 and ST2 included in each memory group MG may be any number larger than or equal to one.

The gates of the memory cell transistors MC of a plurality of memory groups MG aligned in the Z direction are coupled in common to one word line WL. Specifically, the gates of the memory cell transistors MCa0 aligned in the Z direction are coupled in common to a word line WLa0. Similarly, the gates of the memory cell transistors MCa1, MCa2 and MCa3 are respectively coupled to word lines WLa1, WLa2 and WLa3. The gates of the memory cell transistors MCb0 to MCb3 are respectively coupled to word lines WLb0 to WLb3.

The drains of the select transistors ST1 of the memory groups MG aligned in the Z direction are coupled in common to one bit line BL. The gates of the select transistors ST1 of the memory groups MG aligned in the Z direction are coupled to different select gate lines SGD. Specifically, the gate of the select transistor ST1 corresponding to the memory group MG arranged in the lowermost layer is coupled to the select gate line SGD1. The gate of the select transistor ST1 corresponding to the memory group MG arranged in the uppermost layer is coupled to the select gate line SGDn.

The sources of the select transistors ST2 of the memory groups MG aligned in the Z direction are coupled in common to one source line SL. The gates of the select transistors ST2 of the memory groups MG aligned in the Z direction are coupled to different select gate lines SGS. Specifically, the gate of the select transistor ST2 corresponding to the memory group MG arranged in the lowermost layer is coupled to the select gate line SGS1, and the gate of the select transistor ST2 corresponding to the memory group MG arranged in the uppermost layer is coupled to the select gate line SGSn.

Next, couplings between the select gate lines SGD, the contact plugs CSGD, and the global select gate lines GSGD will be described with reference to FIG. 4. Hereinafter, the contact plugs CSGD corresponding to the select gate lines SGD1 to SGDn stacked in the Z direction will be respectively referred to as "CSGD1" to "CSGDn", and the global select gate lines GSGD corresponding thereto will be referred to as "GSGD1" to "GSGDn".

As shown in FIG. 4, the select gate line SGD1 is coupled to the global select gate line GSGD1 via the contact plug CSGD1. The same is true of the other select gate lines SGD. Namely, the select gate lines SGD stacked in the Z direction are coupled to different global select gate lines GSGD via different contact plugs CSGD.

Next, couplings between the select gate lines SGS, the contact plugs CSGS, and the global select gate lines GSGS will be described with reference to FIG. 5. Hereinafter, the contact plugs CSGS corresponding to the select gate lines SGS1 to SGSn stacked in the Z direction will be respectively referred to as "CSGS1" to "CSGSn", and the global select gate lines GSGS corresponding thereto will be referred to as "GSGS1" to "GSGSn".

As shown in FIG. 5, the select gate line SGS1 is coupled to the global select gate line GSGS1 via the contact plug CSGS1. The same is true of the other select gate lines SGS. Namely, the select gate lines SGS stacked in the Z direction are coupled to different global select gate lines GSGS via different contact plugs CSGS.

1.1.4 Layout Configuration of Memory Cell Array

Figure 6:
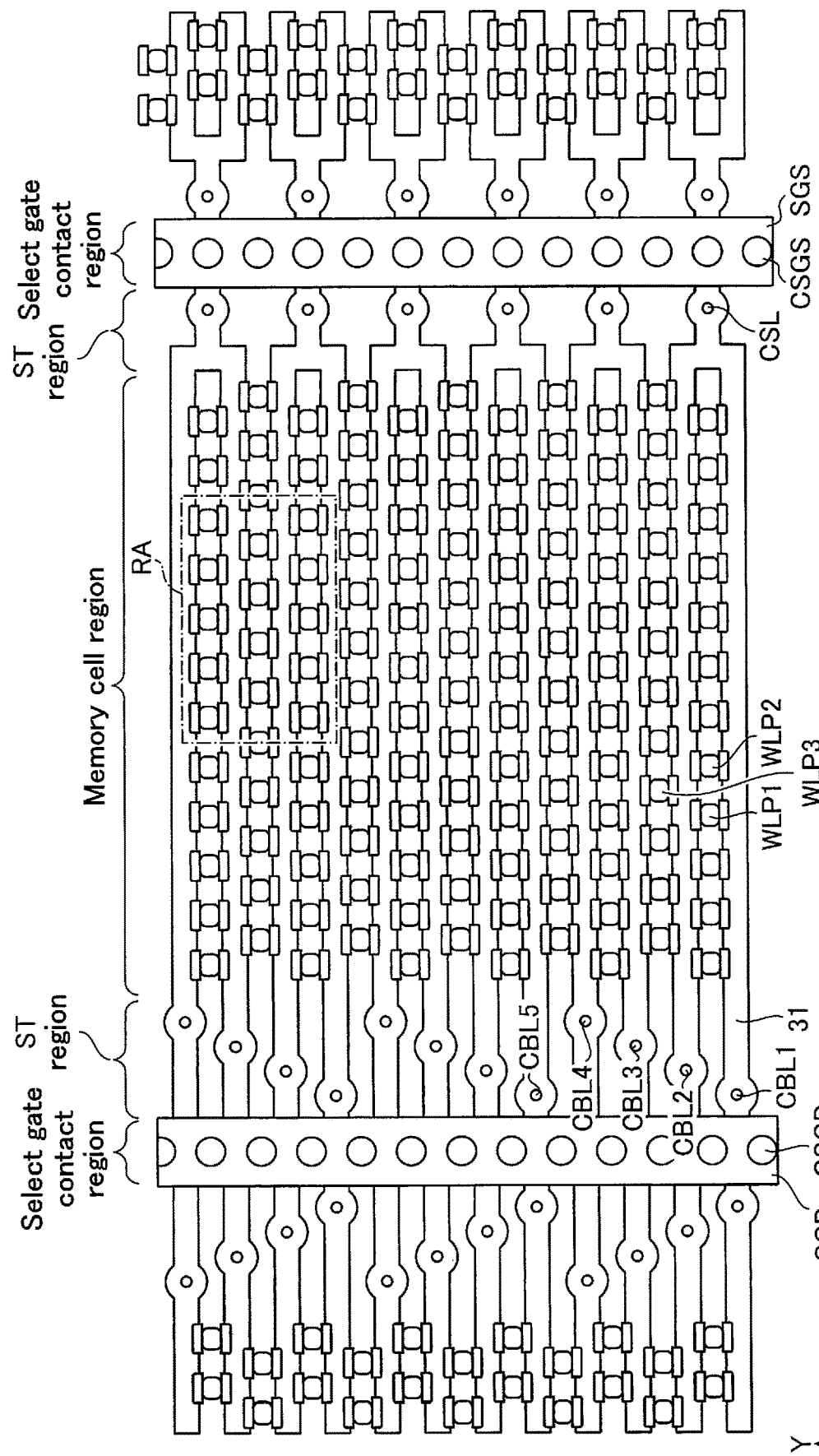
FIG. 6 is a diagram showing a layout configuration of the memory cell array in the first embodiment.

Next, an example of the layout configuration of the memory cell array 18 will be described with reference to FIG. 6. FIG. 6 is diagram showing a layout configuration of the memory cell array 18, and is a top view of the semiconductor layers 31 and select gate lines SGD and SGS in the uppermost layer. In the example of FIG. 6, insulating layers are partly omitted.

As shown in FIG. 6, the memory cell array 18 includes a memory cell region, a drain-side ST region, a source-side ST region, a select gate contact region corresponding to the select gate lines SGD, and a select gate contact region corresponding to the select gate lines SGS.

The memory cell region is a region in which the memory cell transistors MC are provided, i.e., a region in which the word line pillars WLP are arranged. The drain-side ST region is adjacent to the memory cell region in the X direction, and is a region in which the semiconductor layers 31 are coupled to the contact plugs CBL and in which the select transistors ST1 are provided. The source-side ST region is adjacent to the memory cell region in the X direction, and is a region in which the semiconductor layers 31 are coupled to the contact plugs CSL and in which the select transistors ST2 are provided.

The select gate contact region corresponding to the select gate lines SGD is adjacent to the drain-side ST region in the X direction, and is a region in which the contact plugs CSGD are coupled to the select gate lines SGD. The select gate contact region corresponding to the select gate lines SGS is adjacent to the source-side ST region in the X direction, and is a region in which the contact plugs CSGS are coupled to the select gate lines SGS.

The number of memory cell regions, drain-side ST regions, source-side ST regions, select gate contact regions corresponding to the select gate lines SGD, and select gate contact regions corresponding to the select gate lines SGS included in the memory cell array 18 may be any number.

In the memory cell region, a plurality of (12 in the example of FIG. 6) semiconductor layers 31 extending in the X direction are aligned in the Y direction. Between two semiconductor layers 31, a plurality of (12 in the example of FIG. 6) word line pillars WLP are aligned in the X direction. The word line pillars WLP are arranged in a staggered arrangement in the Y direction. For example, the word line pillars WLP1 and WLP2 are arranged adjacent to each other in the X direction, and the word line pillar WLP3 is arranged between the word line pillars WLP1 and WLP2 in the X direction at an approximately intermediate position therebetween with a semiconductor layer 31 interposed between the word line pillar WLP3 and the word line pillars WLP1 and WLP2, and is arranged at a different position from the word line pillars WLP1 and WLP2 in the Y direction.

1.1.4.1 Layout Configuration of Memory Cell Region

Figure 7:
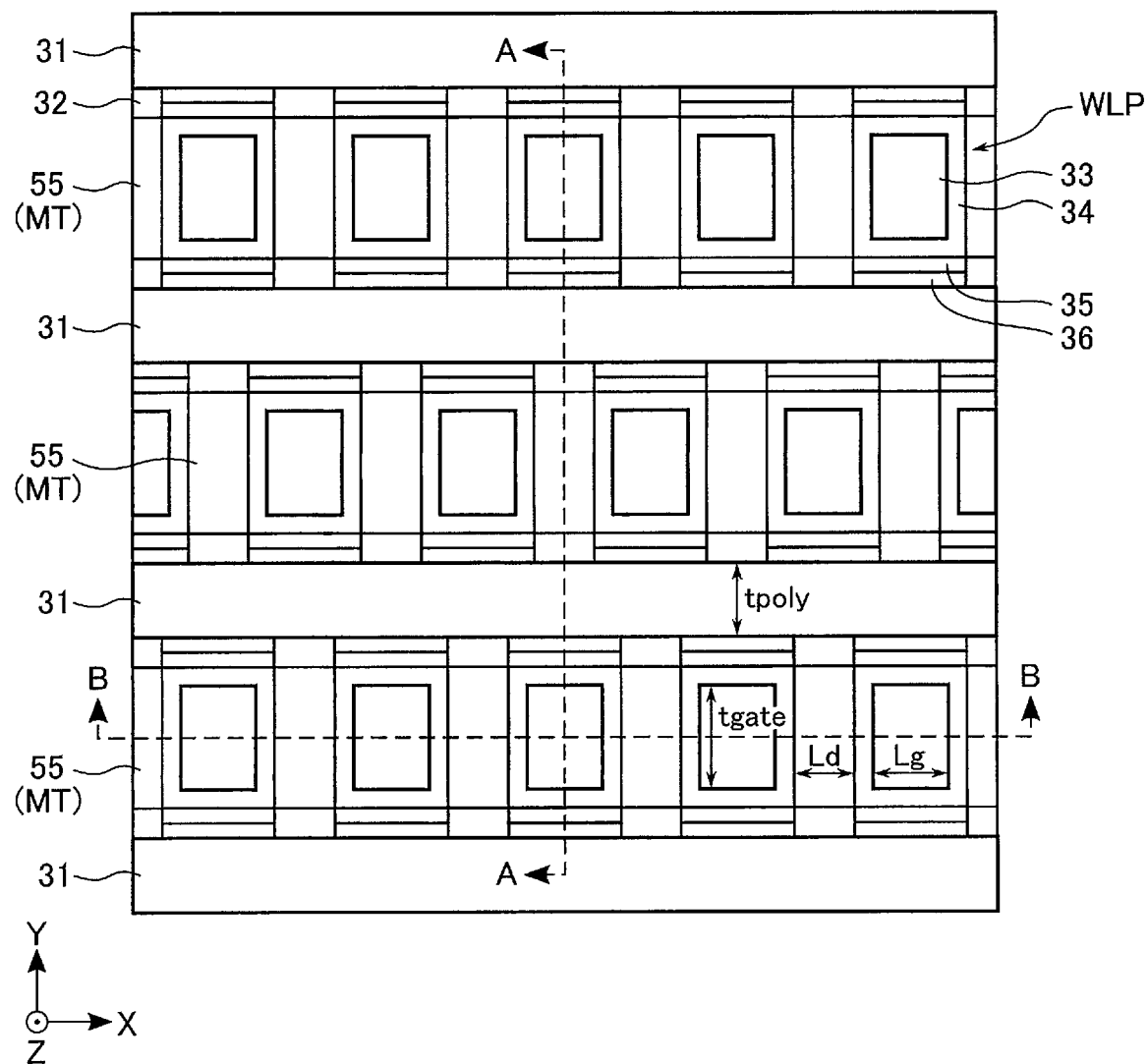
FIG. 7 is a diagram showing a layout configuration of a memory cell region in the first embodiment.

A layout configuration of the memory cell region in the memory cell array 18 will be described with reference to FIG. 7. FIG. 7 is an enlarged view of a region RA in FIG. 6, and shows a layout configuration of the memory cell region. In the example of FIG. 7, insulating layers are partly omitted.

As shown in FIG. 7, a plurality of semiconductor layers 31 extend in the X direction. The semiconductor layers 31 are aligned in the Y direction at predetermined intervals. The semiconductor layers 31 contain, for example, polysilicon doped with impurities.

On each of the Y-directional side surfaces of each semiconductor layer 31, an insulating layer 32 is provided. The insulating layer 32 functions as an etching stopper when a tunnel insulating layer 36 and charge storage layer 35 (to be described later) are formed. The insulating layer 32 contains, for example, silicon nitride.

A memory trench MT is provided between two semiconductor layers 31 aligned in the Y direction. The memory trench MT is a trench provided to divide the semiconductor layers 31 in the Y direction, and an insulating layer (such as silicon oxide) 55 is embedded in the memory trench MT. In the memory trench MT, a plurality of word line pillars WLP are aligned in the X direction at predetermined intervals to divide the insulating layer 55 in the X direction.

Each word line pillar WLP includes a conductive layer 33 and an insulating layer 34 extending in the Z direction. The conductive layer 33 is electrically coupled to a word line WL provided thereabove, and functions as the control gate (or word line) of the memory cell transistor MC. A conductive material is used for the conductive layer 33. The conductive material may be a metal material, a metal compound, or a semiconductor material doped with impurities. The conductive layer 33 contains, for example, tungsten (W) and titanium nitride (TiN). TiN is used as a barrier metal when W is formed by chemical vapor deposition (CVD).

The insulating layer 34 is provided on the side surfaces of the conductive layer 33 so as to surround the periphery of the conductive layer 33 in the X and Y directions. The insulating layer 34 functions as a block insulating layer that prevents the charge stored in the charge storage layer 35 from diffusing into the conductive layer 33 (word line WL). An insulating material is used for the insulating layer 34. The insulating material may be, for example, a stack structure of Hf(Si)Ox/SiO$_2$/Hf(Si)Ox using hafnium (Hf) and silicon oxide (SiO$_2$), a single layer of Hf(Si)Ox or SiO$_2$, or a single layer of zirconium oxide (Zro), aluminum oxide (AlO), or the like. Hf(Si)Ox may be HfOx or HfSiOx.

The charge storage layer 35 and tunnel insulating layer 36 are provided between each word line pillar WLP and corresponding semiconductor layer 31 in order from the word line pillar WLP side. Specifically, the charge storage layer 35 is arranged on each Y-directional side surface of the insulating layer 34, and the tunnel insulating layer 36 is arranged on the side surface of the charge storage layer 35.

The charge storage layer 35 has a function of storing a charge injected from the semiconductor layer 31 in the memory cell transistor MC. As mentioned above, the charge storage layer 35 may be of, for example, the FG type, which uses a conductive layer, or the MONOS type, which uses an insulating layer. Charge storage layers 35 of both the FG type, which uses a conductive layer, and the MONOS type, which uses an insulating layer, may be used. Hereinafter, the case where the charge storage layers 35 are of the FG type will be described.

The conductive layer used for each charge storage layer 35 contains, for example, polysilicon. The conductive layer of the charge storage layer 35 may contain a metal such as tantalum nitride (TaN), titanium nitride (TiN), tungsten (W), or ruthenium (Ru). The tunnel insulating layer 36 contains, for example, silicon oxide or silicon oxynitride (SiON).

1.1.5 Cross-Sectional Structures of Memory Cell Region

Figure 8:
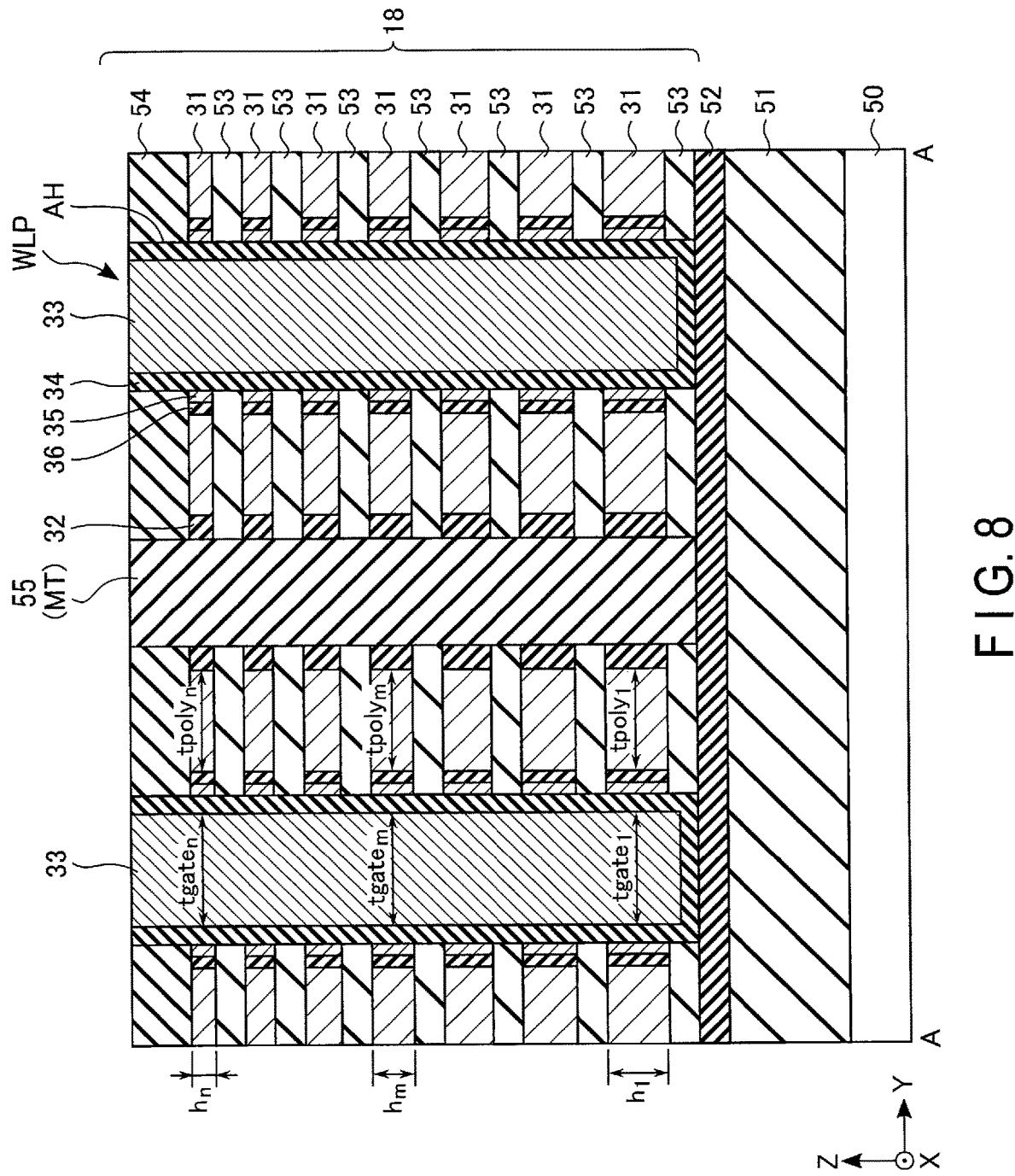
FIG. 8 is a cross-sectional view of the memory cell region in the first embodiment, taken along line A-A.
Figure 9:
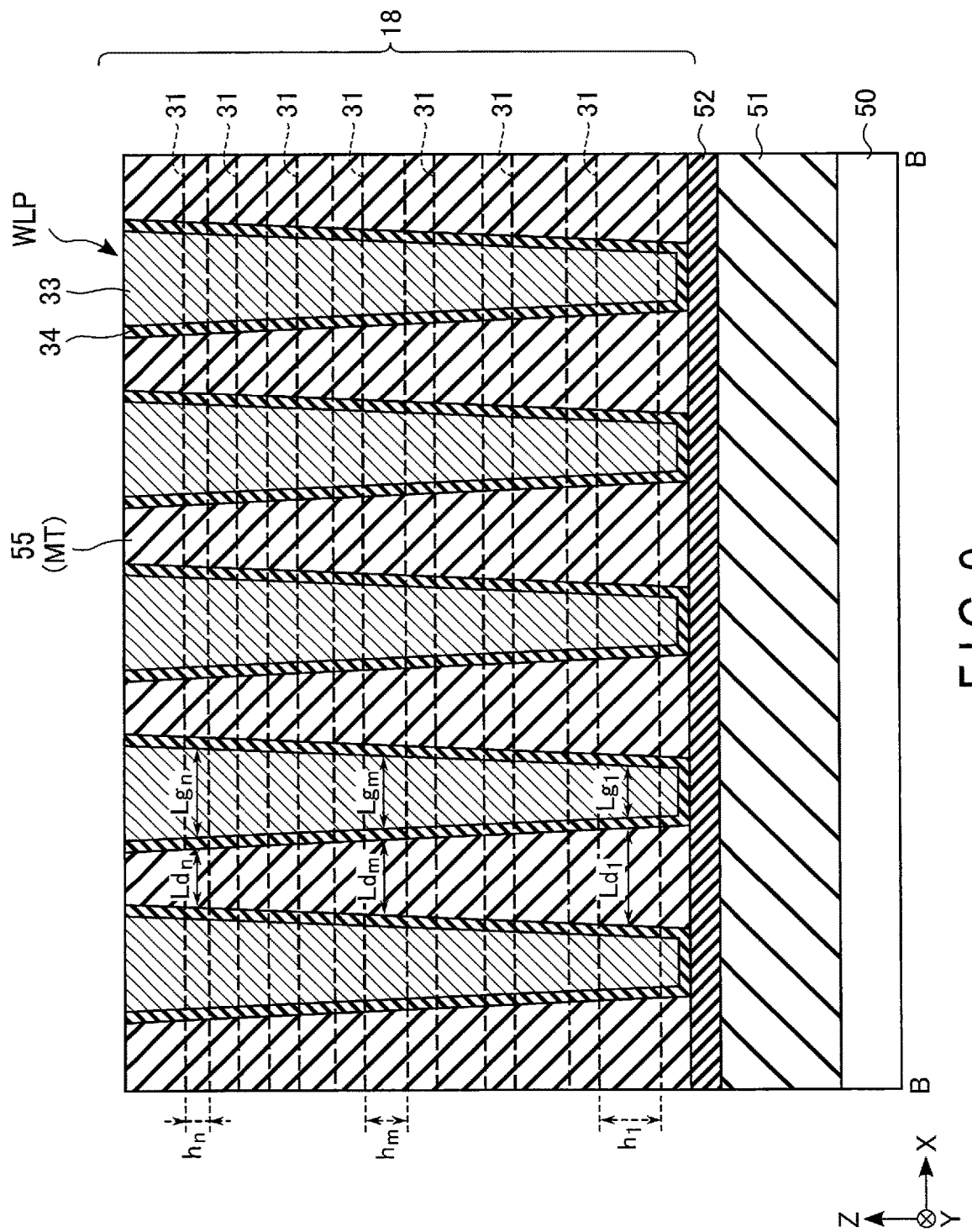
FIG. 9 is a cross-sectional view of the memory cell region in the first embodiment, taken along line B-B.

Next, cross-sectional structures of the memory cell region in the memory cell array 18 will be described with reference to FIGS. 8 and 9. FIG. 8 is a cross-sectional view taken along line A-A in FIG. 7. FIG. 9 is a cross-sectional view taken along line B-B in FIG. 7.

As shown in FIGS. 8 and 9, an insulating layer 51 is provided on a semiconductor substrate 50. The insulating layer 51 may include a transistor (not shown) or interconnect layers (not shown) formed on the semiconductor substrate 50. The insulating layer 51 contains, for example, silicon oxide ($SiO_2$).

The memory cell array 18 is provided on the insulating layer 51. Specifically, an insulating layer 52 is provided on the insulating layer 51. The insulating layer 52 functions as an etching stopper when the memory trenches MT and holes used for various contact plugs and the like are processed. The insulating layer 52 may be any insulating material that can achieve a sufficient etching selectivity with respect to insulating layers 53 provided in upper layers. The insulating layer 52 contains, for example, silicon nitride (SiN) or a metal oxide such as aluminum oxide (AlO).

An insulating layer 53 is provided on the insulating layer 52. The insulating layer 53 contains, for example, silicon oxide.

On the insulating layer 53, for example seven semiconductor layers 31 are stacked with insulating layers 53 interposed therebetween. Namely, seven insulating layers 53 and seven semiconductor layers 31 are alternately stacked on the insulating layer 52. The number of stacked semiconductor layers 31 may be any number. An insulating layer 54 is provided on the uppermost semiconductor layer 31. The insulating layer 54 contains, for example, silicon oxide.

Each word line pillar WLP extends in the Z direction to intersect the insulating layer 54, the alternately-stacked seven semiconductor layers 31 and seven insulating layers 53. The word line pillar WLP passes from above the insulating layer 54 in the Z direction between a stack of the insulating layer 54, semiconductor layers 31 and insulating layers 53, and another stack of the insulating layer 54, semiconductor layers 31 and insulating layers 53 adjacent to the aforementioned stack in the Y direction, to reach the insulating layer 52.

As described above, the word line pillar WLP includes the conductive layer 33 and insulating layer 34 extending in the Z direction. Specifically, a hole AH is formed in the Z direction to intersect the insulating layer 54, semiconductor layers 31, and insulating layers 53. An insulating layer 34 is formed on the side and bottom surfaces of the hole AH. On the side surfaces of the insulating layer 34, the conductive layer 33 is formed to fill the inside of the hole AH.

The charge storage layer 35 and tunnel insulating layer 36 are provided between the insulating layer 34 and each semiconductor layer 31 in order from the insulating layer 34 side. Specifically, the charge storage layer 35 is provided between the insulating layer 34 and each semiconductor layer 31 so as to be in contact with the side surface of the insulating layer 34. Furthermore, the tunnel insulating layer 36 is provided between the charge storage layer 35 and the semiconductor layer 31.

The memory trench MT passes from above the insulating layer 54 in the Z direction between a stack of the insulating layer 54, semiconductor layers 31, and insulating layers 53 and another stack of the insulating layer 54, semiconductor layers 31, and insulating layers 53 adjacent to the aforementioned stack in the Y direction, to reach the insulating layer 52. The insulating layer 55 is provided in the memory trench MT. The insulating layer 32 is further provided between the insulating layer 55 and each semiconductor layer 31.

As shown in FIG. 8, the Z-directional thickness of the semiconductor layer 31 gradually increases from the uppermost semiconductor layer 31 to the lowermost semiconductor layer 31. In other words, the thickness of the semiconductor layer 31 gradually decreases from the lowermost semiconductor layer 31 to the uppermost semiconductor layer 31. Namely, in the cross-sectional structure shown in FIG. 8, the relationship between the thicknesses h1, hm, and hn of the semiconductor layers 31 is expressed as h1>hm>hn, where the thickness of the lowermost semiconductor layer 31 is h1, the thickness of a middle semiconductor layer 31 between the lowermost and uppermost semiconductor layers 31 is hm, and the thickness of the uppermost semiconductor layer 31 is hn.

As shown in FIG. 9, the X-directional width of the conductive layer 33 in each word line pillar WLP (hereinafter referred to as a "word line length") gradually increases from the portion of the conductive layer 33 corresponding to the lowermost semiconductor layer 31 to the portion of the conductive layer 33 corresponding to the uppermost semiconductor layer 31. Namely, in the cross-sectional structure shown in FIG. 9, the relationship between word line lengths Lg1, Lgm, and Lgn is expressed as Lg1<Lgm<Lgn, where the X-directional width (word line length) of the conductive layer 33 corresponding to the lowermost semiconductor layer 31 is Lg1, the word line length of the conductive layer 33 corresponding to the middle semiconductor layer 31 is Lgm, and the word line length of the conductive layer 33 corresponding to the uppermost semiconductor layer 31 is Lgn. The conductive layer 33 corresponding to a semiconductor layer 31 refers to the portion of the conductive layer 33 on the same X-Y plane as the semiconductor layer 31. Namely, the conductive layer 33 corresponding to a semiconductor layer 31 refers to the portion of the conductive layer 33 at the same distance (level) as the semiconductor layer 31 from the semiconductor substrate 50 surface. When the word line lengths Lg1, Lgm, and Lgn are not distinguished from one another, each length will be referred to as a word line length Lg.

In contrast to the word line lengths Lg, the X-directional distance between adjacent word line pillars WLP gradually decreases from between word line pillars WLP corresponding to the lowermost semiconductor layer 31 to between word line pillars WLP corresponding to the uppermost semiconductor layer 31. Namely, in the cross-sectional structure shown in FIG. 9, the relationship between the distances Ld1, Ldm, and Ldn between word line pillars WLP is expressed as Ld1>Ldm>Ldn, where the distance between word line pillars WLP corresponding to the lowermost semiconductor layer 31 is Ld1, the distance between word line pillars WLP corresponding to the middle semiconductor layer 31 is Ldm, and the distance between word line pillars WLP corresponding to the uppermost semiconductor layer 31 is Ldn. When the distances Ld1, Ldm, and Ldn between word line pillars WLP are not distinguished from one another, each distance will be referred to as a distance Ld.

As shown in FIG. 8, the Y-directional length of the semiconductor layer 31 between each word line pillar WLP and the memory trench MT (or insulating layer 55) is approximately the same from the lowermost semiconductor layer 31 to the uppermost semiconductor layer 31. Namely, in the cross-sectional structure shown in FIG. 8, the relationship between the Y-directional lengths tpoly1, tpolym, and tpolyn of the semiconductor layers 31 is expressed as tpoly1=tpolym=tpolyn, where the Y-directional length of the lowermost semiconductor layer 31 is tpoly1, the Y-directional length of the middle semiconductor layer 31 is tpolym, and the Y-directional length of the uppermost semiconductor layer 31 is tpolyn. When the lengths tpoly1, tpolym, and tpolyn are not distinguished from one another, each length will be referred to as a length tpoly.

The Y-directional width of the conductive layer 33 in the word line pillar WLP (hereinafter referred to as a "word line width") is approximately the same from the portion of the conductive layer 33 corresponding to the lowermost semiconductor layer 31 to the portion of the conductive layer 33 corresponding to the uppermost semiconductor layer 31. Namely, in the cross-sectional structure shown in FIG. 8, the relationship between word line widths tgate1, tgatem, and tgaten is expressed as tgate1=tgatem=tgaten, where the Y-directional width (word line width) of the conductive layer 33 corresponding to the lowermost semiconductor layer 31 is tgate1, the word line width of the conductive layer 33 corresponding to the middle semiconductor layer 31 is tgatem, and the word line width of the conductive layer 33 corresponding to the uppermost semiconductor layer 31 is tgaten. When the word line widths tgate1, tgatem, and tgaten are not distinguished from one another, each width will be referred to as a word line width tgate.

As described above, the memory cell region of the first embodiment has a configuration in which the thickness h1 of a semiconductor layer 31 on the lower layer side is larger than the thickness hn of a semiconductor layer 31 on the upper layer side (h1>hm>hn), the X-directional width (word line length) Lg1 of the conductive layer 33 on the lower layer side is smaller than the X-directional width Lgn of the conductive layer 33 on the upper layer side (Lg1<Lgm<Lgn), and the distance Ld1 between word line pillars WLP on the lower layer side is larger than the distance Ldn between word line pillars WLP on the upper layer side (Ld1>Ldm>Ldn)

1.2 Method for Manufacturing Semiconductor Memory Device

Next, a method for manufacturing the memory cell region in the semiconductor memory device of the first embodiment will be described with reference to FIGS. 10 to 15. FIGS. 10 to 15 are diagrams showing a method for manufacturing the memory cell region in the memory cell array 18. FIGS. 10 to 15 each show a top view of the uppermost semiconductor layer ("semiconductor layer top") in a manufacturing step, a cross section taken along line A1-A2 ("cross section A1-A2") and a cross section taken along line B1-B2 ("cross section B1-B2"). Similarly, each of the figures of manufacturing steps of the subsequent embodiments also shows a top view of the uppermost semiconductor layer 31, a cross section taken along line A1-A2, and a cross section taken along line B1-B2.

Figure 10:
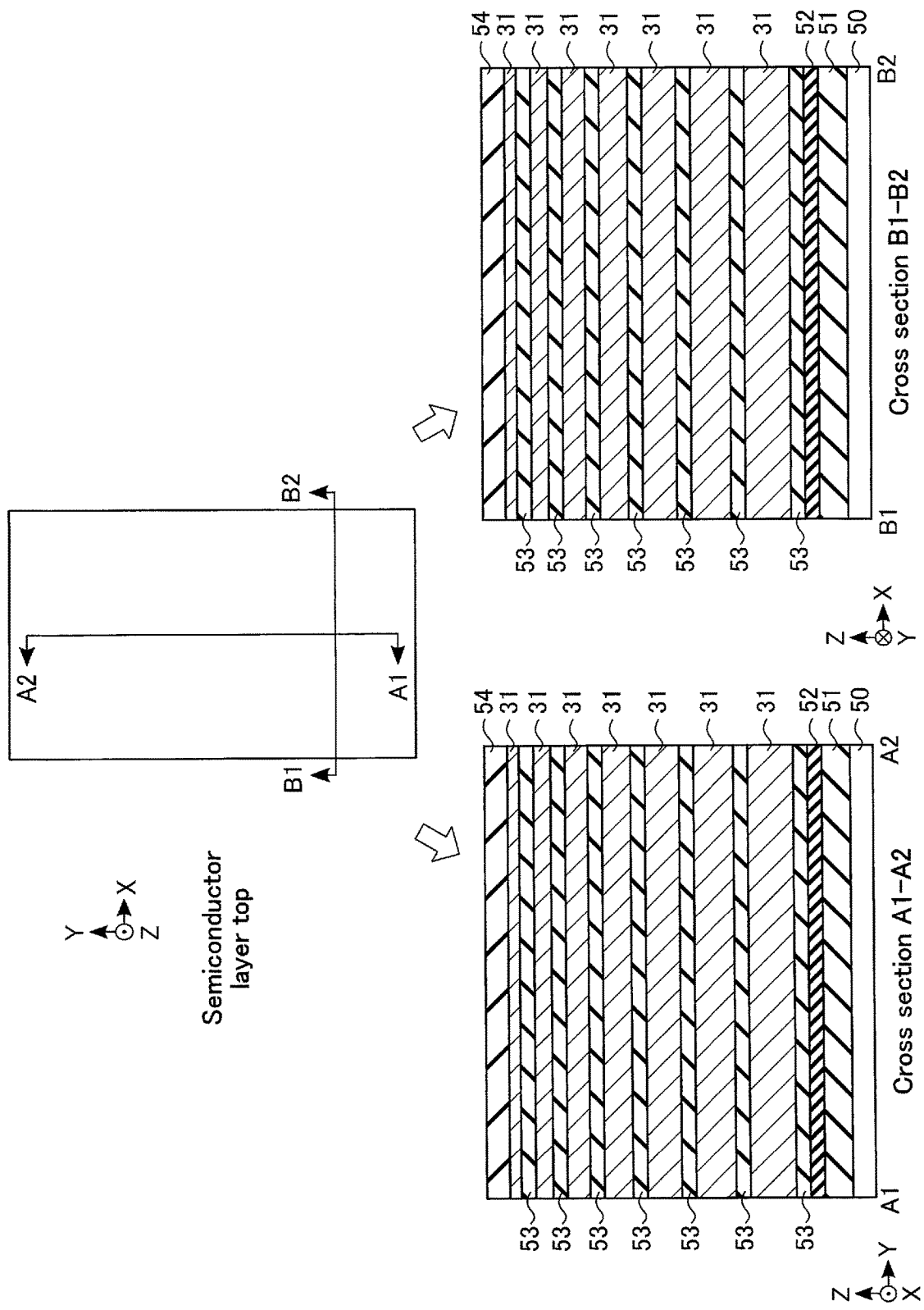
FIGS. 10 to 15 are diagrams showing a method for manufacturing the memory cell region in the first embodiment.

First, as shown in FIG. 10, the insulating layers 51 and 52 are sequentially stacked on the semiconductor substrate 50. Next, for example, the seven insulating layers 53 and the seven semiconductor layers 31 are alternately stacked on the insulating layer 52. The seven semiconductor layers 31 are formed by, for example, CVD, to gradually become thinner in the Z direction from the lower layer side to the upper layer side. The insulating layer 54 is further formed on the uppermost semiconductor layer 31.

Figure 11:
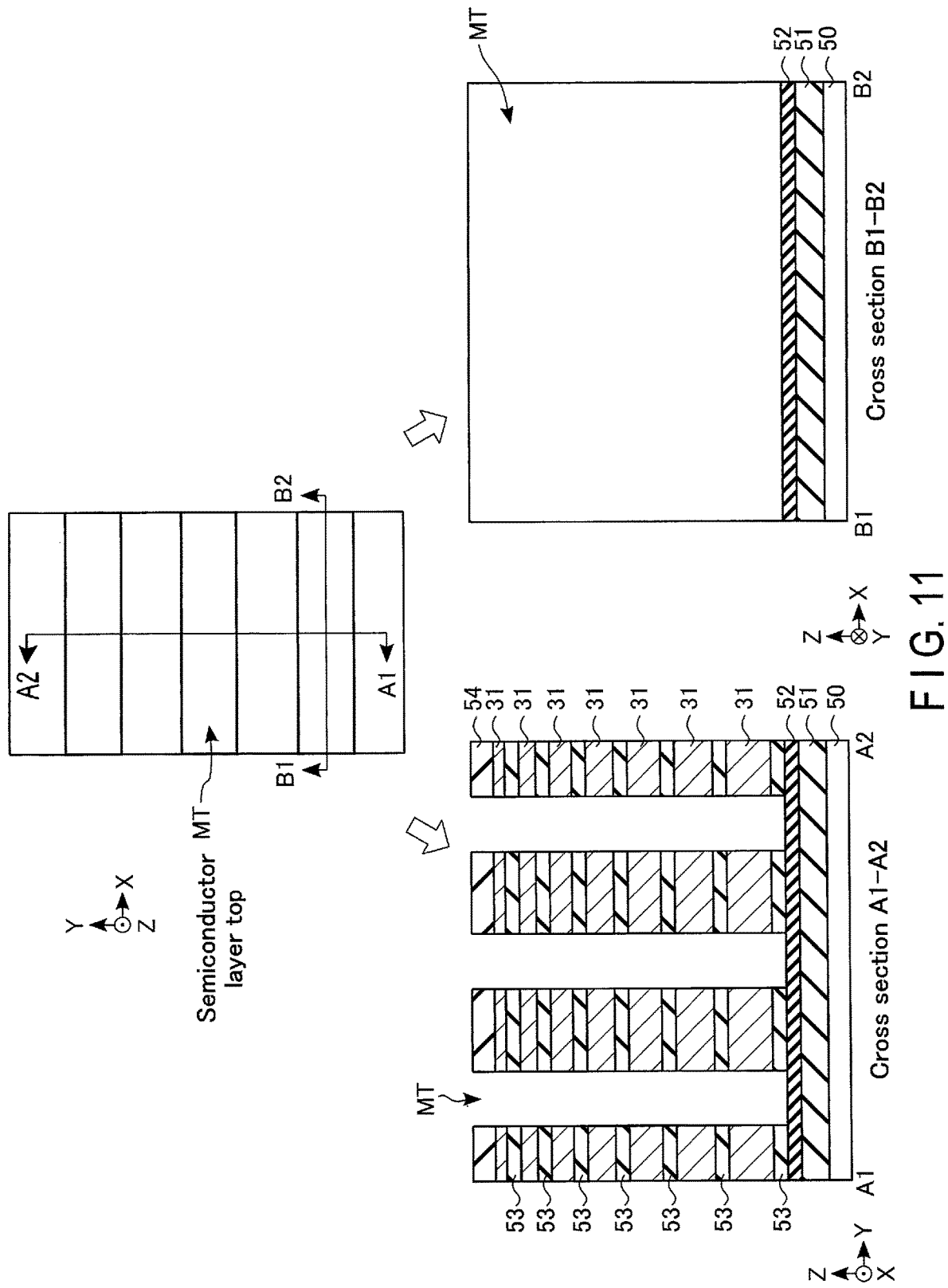

Next, as shown in FIG. 11, the memory trench MT, which passes through the insulating layer 54, the seven semiconductor layers 31, and the seven insulating layers 53 to reach the insulating layer 52 at its bottom, is formed by dry etching. The memory trench MT is formed to have approximately the same width from the opening to the bottom in the Y-directional cross-section (cross section A1-A2).

Figure 12:
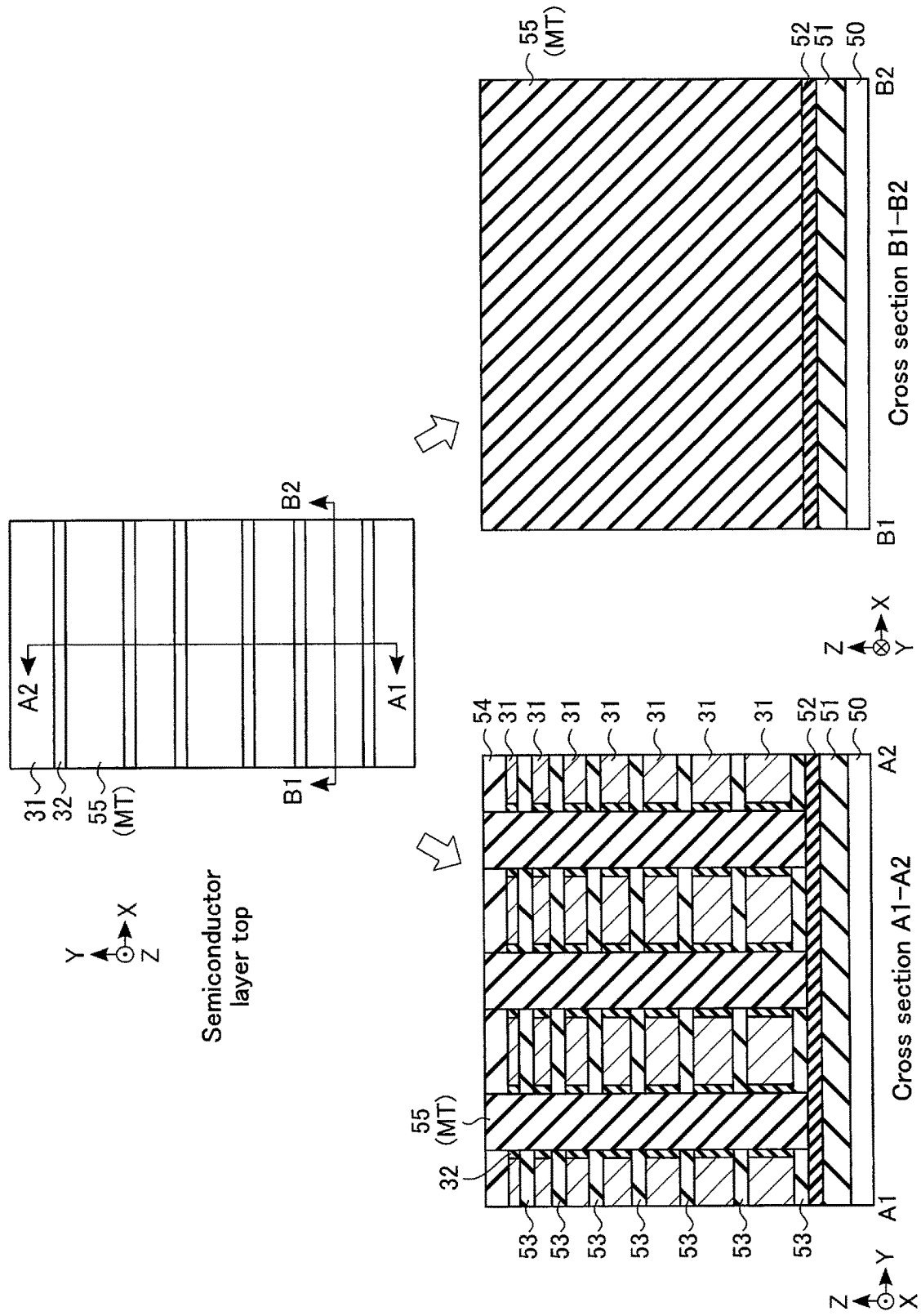

Next, as shown in FIG. 12, the semiconductor layers 31 are each partly removed from the side surface of the memory trench MT, and the insulating layer 32 is formed in the regions from which the semiconductor layers 31 have been removed. Furthermore, the insulating layer 55 is formed in the memory trench MT.

Specifically, the semiconductor layers 31 are each partly etched from the side surface of the open memory trench MT by, for example, wet etching, thereby forming a recess region. Then, the insulating layer 32 is formed on the side and bottom surfaces of the memory trench MT, which include the recess regions, and on the insulating layer 54. The extra insulating layer 32 on the side and bottom surfaces of the memory trench MT and on the insulating layer 54 is removed by etching back, while leaving the insulating layer 32 in the recess regions. Next, the insulating layer 55 is embedded in the memory trench MT by, for example, CVD.

Figure 13:
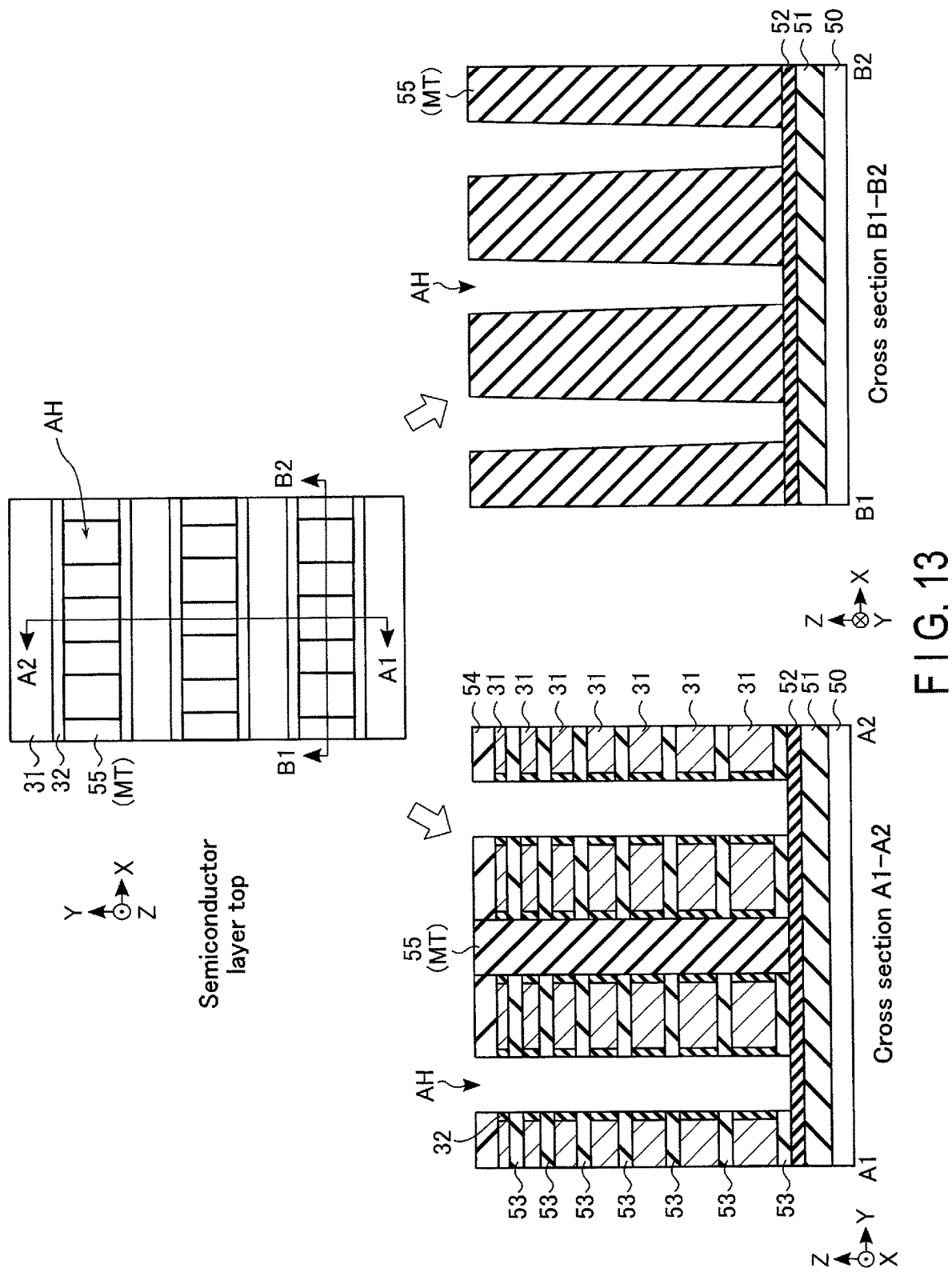

As shown in FIG. 13, the insulating layer 55 is partly removed by dry etching, thereby forming a hole AH.

Figure 14:
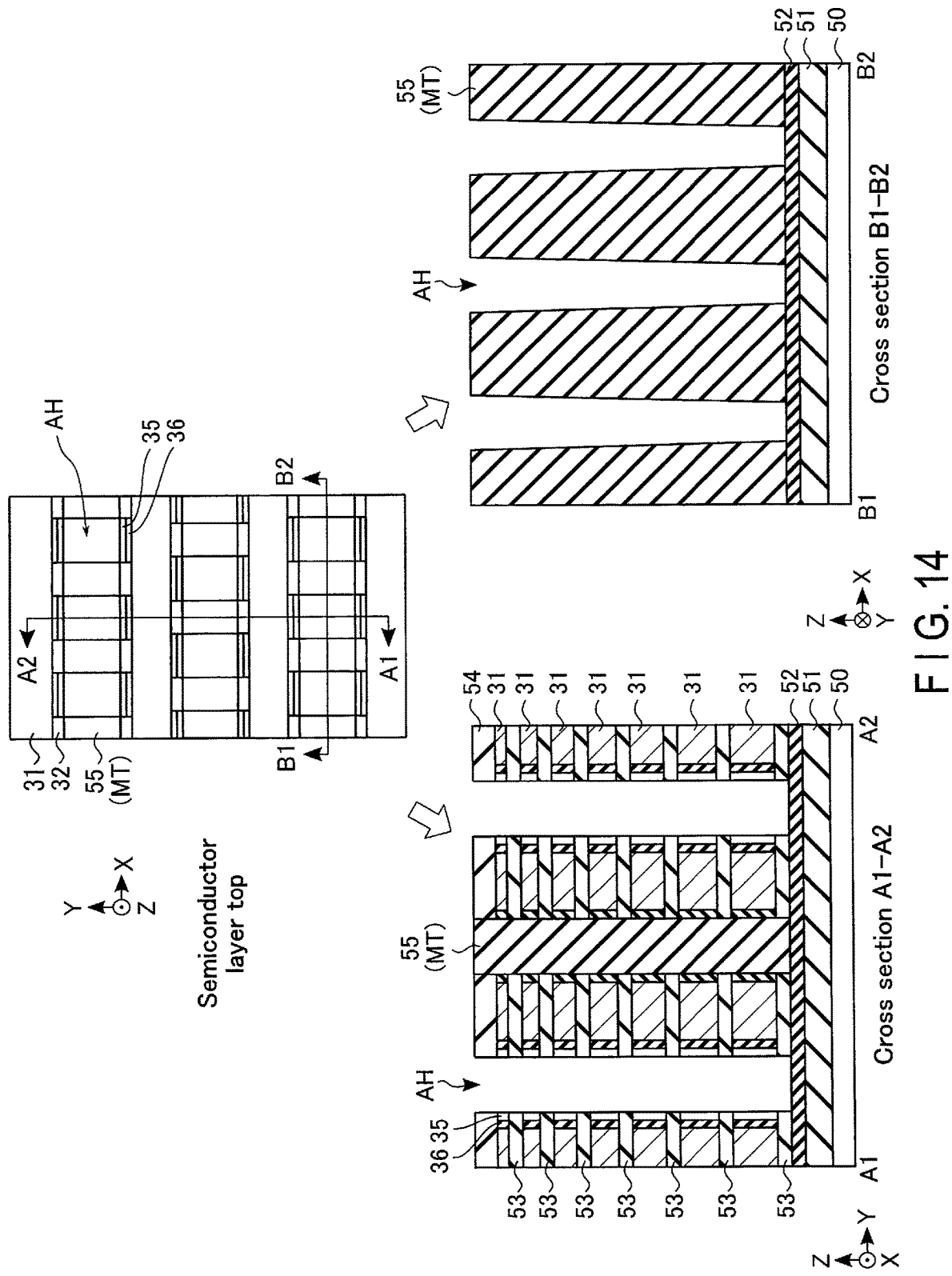

As shown in FIG. 14, the tunnel insulating layer 36 and the charge storage layer 35 are formed on the Y-directional side surfaces of the hole AH.

Specifically, the insulating layer 32 around the hole AH is removed by, for example, wet etching. Thereafter, the side surfaces of each semiconductor layer 31 exposed to the hole AH are oxidized by oxidation treatment, thereby forming the tunnel insulating layer 36. The charge storage layer 35 is then formed on the side and bottom surfaces of the hole AH and on the insulating layer 54. The extra charge storage layer 35 on the side and bottom surfaces of the hole AH and on the insulating layer 54 is removed by etching back, while leaving the charge storage layer 35 on the side surface of the tunnel insulating layer 36.

Figure 15:
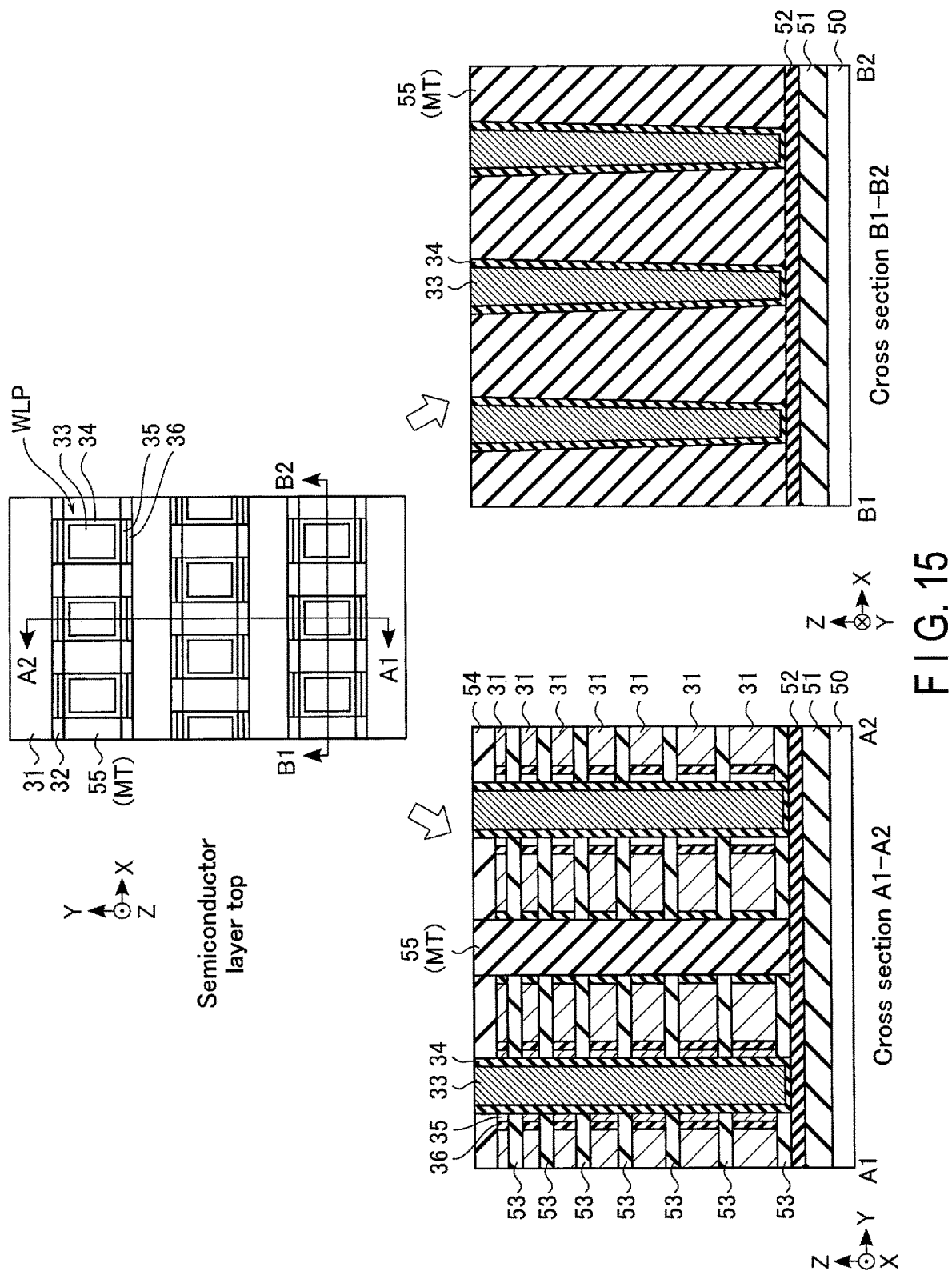

As shown in FIG. 15, the insulating layer 34 is formed on the side and bottom surfaces of the hole AH, and the conductive layer 33 is then formed in the hole AH.

Specifically, the insulating layer 34 is formed on the bottom and side surfaces of the hole AH by, for example, CVD. Next, for example, TiN and W as the conductive layer 33 are sequentially formed by CVD. Thereafter, TiN and W on the insulating layer 54 are removed by, for example, chemical mechanical polishing (CMP). The memory cell region shown in FIG. 15 is formed by the above-described steps.

1.3 Advantages of First Embodiment

The semiconductor memory device according to the first embodiment can improve reliability of the read operation. Advantages of the first embodiment will be described below.

A structure in which a plurality of semiconductor layers 31 extending in the X direction are stacked above the semiconductor substrate 50, and word line pillars WLP extending in the Z direction to intersect these semiconductor layers 31 are provided may be formed by embedding a material that forms the word line pillars WLP into holes AH. Due to the processing condition of the holes AH, the X-directional width (word line length) Lg of the conductive layer 33 in the word line pillar WLP tends to be smaller on the lower layer side close to the semiconductor substrate 50 than on the upper layer side far from the semiconductor substrate 50, and the X-directional distance Ld between word line pillars WLP tends to be larger on the lower layer side than on the upper layer side. In other words, the gate length Lg of a memory cell transistor MC tends to be smaller on the lower layer side close to the semiconductor substrate 50 than on the upper layer side far from the semiconductor substrate 50, and the distance Ld between gates of memory cell transistors MC tends to be larger on the lower layer side than on the upper layer side. Accordingly, the gate length Lg of a memory cell transistor MC runs counter to the distance Ld between gates of memory cell transistors MC and, as the gate length Lg of a memory cell transistor MC on the lower layer side decreases, the distance Ld between gates of memory cell transistors MC increases, and the resistance between gates increases. As a result, there arises a concern about a decrease in the drain current that flows through a memory cell transistor MC on the lower layer side when a word line voltage (control gate voltage) is applied thereto. The drain current corresponds to, for example, a current that flows through a memory cell transistor MC in a read operation (hereinafter referred to as a cell current). Therefore, reliability of the read operation in the semiconductor memory device may deteriorate.

The semiconductor memory device of the first embodiment has a configuration in which: the thickness of a first semiconductor layer 31 on the lower layer side is larger than the thickness of a second semiconductor layer 31 on the upper layer side, i.e., h1>hm>hn is satisfied; and the word line pillar WLP has a first portion intersecting the first semiconductor layer 31 on the lower layer side and a second portion intersecting the second semiconductor layer 31 on the upper layer side, and an X-directional first width Lg1 of the first portion is smaller than an X-directional second width Lgn of the second portion, i.e., Lg1<Lgm<Lgn is satisfied.

The semiconductor memory device also has a configuration in which: the thickness of the first semiconductor layer 31 on the lower layer side is larger than the thickness of the second semiconductor layer 31 on the upper layer side, i.e., h1>hm>hn is satisfied; and a first distance Ld1 between a first conductive layer 33 and a second conductive layer 33 adjacent to each other in the X direction at a portion (level) where each word line pillar WLP intersects the first semiconductor layer 31 on the lower layer side is larger than a second distance Ldn between the first conductive layer 33 and the second conductive layer 33 at a portion (level) where each word line pillar WLP intersects the second semiconductor layer 31 on the upper layer side, i.e., Ld1>Ldm>Ldn.

The above configurations can make the Z-directional length of the channel layer formed in the semiconductor layer 31 on the lower layer side larger than that in the semiconductor layer 31 on the upper layer side, and the thickness of the semiconductor layer 31 between gates of memory cell transistors MC on the lower layer side larger than that between gates of memory cell transistors MC on the upper layer side. Accordingly, the resistance between gates of memory cell transistors MC on the lower layer side can be lowered, and a decrease in the cell current in each memory cell transistor MC on the lower layer side can be suppressed. As a result, reliability of the read operation can be improved. In a write operation and erase operation, a write verification operation and erase verification operation, which correspond to the read operation, are respectively performed. Therefore, in the first embodiment, reliability of the write operation and erase operation can also be improved.

FIG. 16 shows voltage-current characteristics of memory cell transistors MC in the first embodiment and a comparative example. In FIG. 16, the horizontal axis represents word line voltages (control gate voltages), and the vertical axis represents drain currents (i.e., cell currents) of memory cell transistors MC. The current characteristic I1L indicates voltage-current characteristics of memory cell transistors MC in the region where the lowermost semiconductor layer 31 intersects each word line pillar WLP in the first embodiment. The current characteristic I1U indicates voltage-current characteristics of memory cell transistors MC in the region where the uppermost semiconductor layer 31 intersects each word line pillar WLP in the first embodiment. The current characteristic ICO is a current characteristic of the comparative example, and indicates voltage-current characteristics of memory cell transistors in the region where the lowermost semiconductor layer intersects each word line pillar WLP in the case where the thickness of the semiconductor layer is the same on the upper layer side and the lower layer side.

As shown in FIG. 16, the current characteristic I1L of the first embodiment indicates that a large drain current can be obtained with the same threshold voltage in comparison with the current characteristic ICO of the comparative example. In other words, the current characteristic I1L indicates that the cell current equivalent to that of the current characteristic I1U can be obtained with no decrease in the cell current. Therefore, the first embodiment can prevent deterioration in the voltage-current characteristics of memory cell transistors MC on the lower layer side and can suppress reduction in the cell current. As a result, reliability of the read operation can be improved. Furthermore, reliability of the write operation and erase operation can be improved.

2. Second Embodiment

Next, a semiconductor memory device according to a second embodiment will be described. Described in the second embodiment is a case where the Y-directional dimension of each word line pillar WLP is small in a lower layer portion, and large in an upper layer portion. The other circuit configuration, overall configuration, layout configuration, and cross-sectional structure are the same as those of the first embodiment. In the second embodiment, points different from the first embodiment will be mainly described.

2.1 Cross-Sectional Structure of Memory Cell Region

Figure 17:
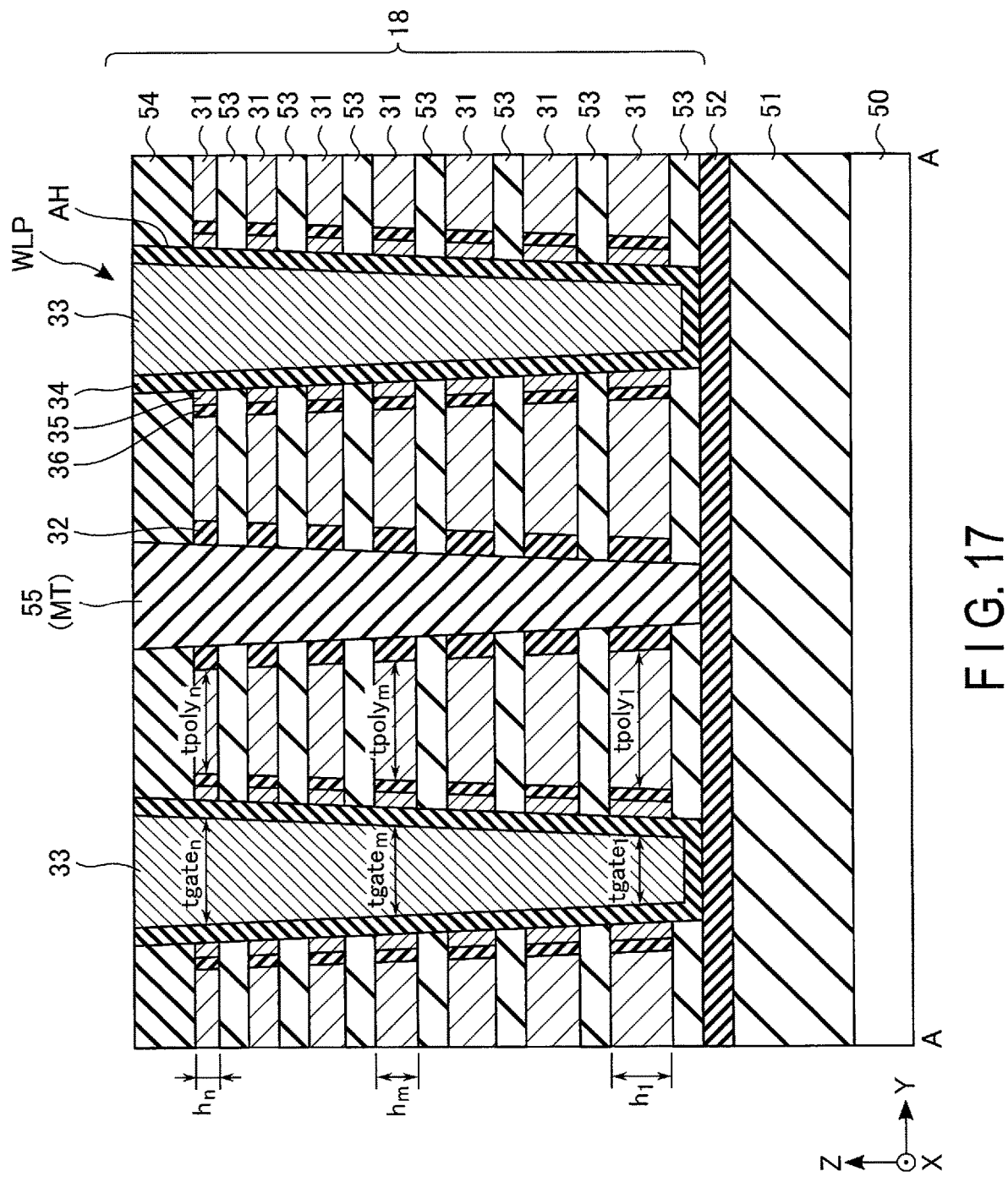
FIG. 17 is a cross-sectional view of a memory cell region in a second embodiment, taken along line A-A.

A cross-sectional structure of the memory cell region in the memory cell array 18 will be described with reference to FIGS. 17 and 9. FIG. 17 is a cross-sectional view taken along line A-A in FIG. 7, showing a Y-directional cross section of the memory cell region in the second embodiment. The X-directional cross section of the memory cell region of the second embodiment is the same as the cross section shown in FIG. 9.

As shown in FIG. 17, the Z-directional thickness of the semiconductor layer 31 gradually increases from the uppermost semiconductor layer 31 to the lowermost semiconductor layer 31 as in the first embodiment. In other words, the Z-directional thickness of the semiconductor layer 31 gradually decreases from the lowermost semiconductor layer 31 to the uppermost semiconductor layer 31. Namely, the relationship between the thickness h1 of the lowermost semiconductor layer 31, the thickness hm of the middle semiconductor layer 31, and the thickness hn of the uppermost semiconductor layer 31 is expressed as h1>hm>hn.

As in the first embodiment shown in FIG. 9, the X-directional width (word line length) of the conductive layer 33 in each word line pillar WLP gradually increases from a portion of the conductive layer 33 corresponding to the lowermost semiconductor layer 31 to a portion of the conductive layer 33 corresponding to the uppermost semiconductor layer 31. Namely, the relationship between the X-directional width (word line length) Lg1 of the conductive layer 33 corresponding to the lowermost semiconductor layer 31, the word line length Lgm of the conductive layer 33 corresponding to the middle semiconductor layer 31, and the word line length Lgn of the conductive layer 33 corresponding to the uppermost semiconductor layer 31 is expressed as Lg1<Lgm<Lgn.

The relationship between the distance Ld1 between word line pillars WLP corresponding to the lowermost semiconductor layer 31, the distance Ldm between word line pillars WLP corresponding to the middle semiconductor layer 31, and the distance Ldn between word line pillars WLP corresponding to the uppermost semiconductor layer 31 is expressed as Ld1>Ldm>Ldn.

As shown in FIG. 17, the relationship between the Y-directional length tpoly1 of the lowermost semiconductor layer 31, the Y-directional length tpolym of the middle semiconductor layer 31, and the Y-directional length tpolyn of the uppermost semiconductor layer 31 is expressed as tpoly1>tpolym>tpolyn.

The relationship between the Y-directional width (word line width) tgate1 of the conductive layer 33 corresponding to the lowermost semiconductor layer 31, the word line width tgatem of the conductive layer 33 corresponding to the middle semiconductor layer 31, and the word line width tgaten of the conductive layer 33 corresponding to the uppermost semiconductor layer 31 is expressed as tgate1<tgatem<tgaten.

As described above, the memory cell region of the second embodiment has a configuration in which: the thickness h1 of a semiconductor layer 31 on the lower layer side is larger than the thickness hn of a semiconductor layer 31 on the upper layer side (h1>hm>hn), the X-directional width (word line length) Lg1 of the conductive layer 33 on the lower layer side is smaller than the X-directional width Lgn of the conductive layer 33 on the upper layer side (Lg1<Lgm<Lgn), the distance Ld1 between word line pillars WLP on the lower layer side is larger than the distance Ldn between word line pillars WLP on the upper layer side (Ld1>Ldm>Ldn), and the Y-directional length tpoly1 of a semiconductor layer 31 on the lower layer side is larger than the Y-directional length tpolyn of a semiconductor layer 31 on the upper layer side (tpoly1>tpolym>tpolyn).

2.2 Method for Manufacturing Semiconductor Memory Device

Next, a method for manufacturing the memory cell region in the semiconductor memory device of the second embodiment will be described with reference to FIGS. 18 to 23. FIGS. 18 to 23 are diagrams showing a method for manufacturing the memory cell region in the second embodiment.

Figure 18:
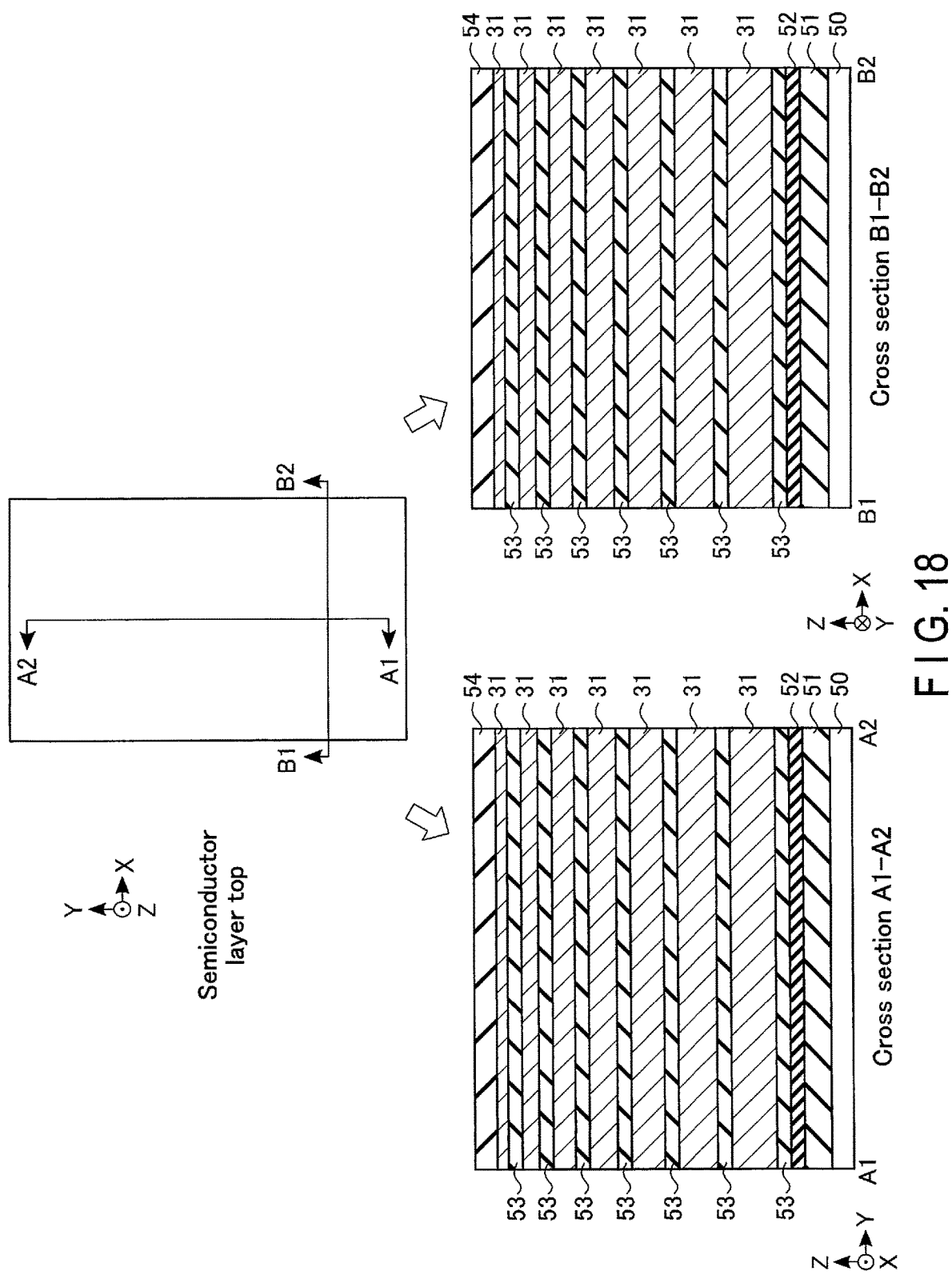
FIGS. 18 to 23 are diagrams showing a method for manufacturing the memory cell region in the second embodiment.

As shown in FIG. 18, the insulating layers 51 and 52 are sequentially stacked on the semiconductor substrate 50 and, for example, the seven insulating layers 53 and seven semiconductor layers 31 are alternately stacked on the insulating layer 52. The seven semiconductor layers 31 are formed by, for example, CVD, to gradually become thinner in the Z direction from the lower layer side to the upper layer side. The insulating layer 54 is further formed on the uppermost semiconductor layer 31.

Figure 19:
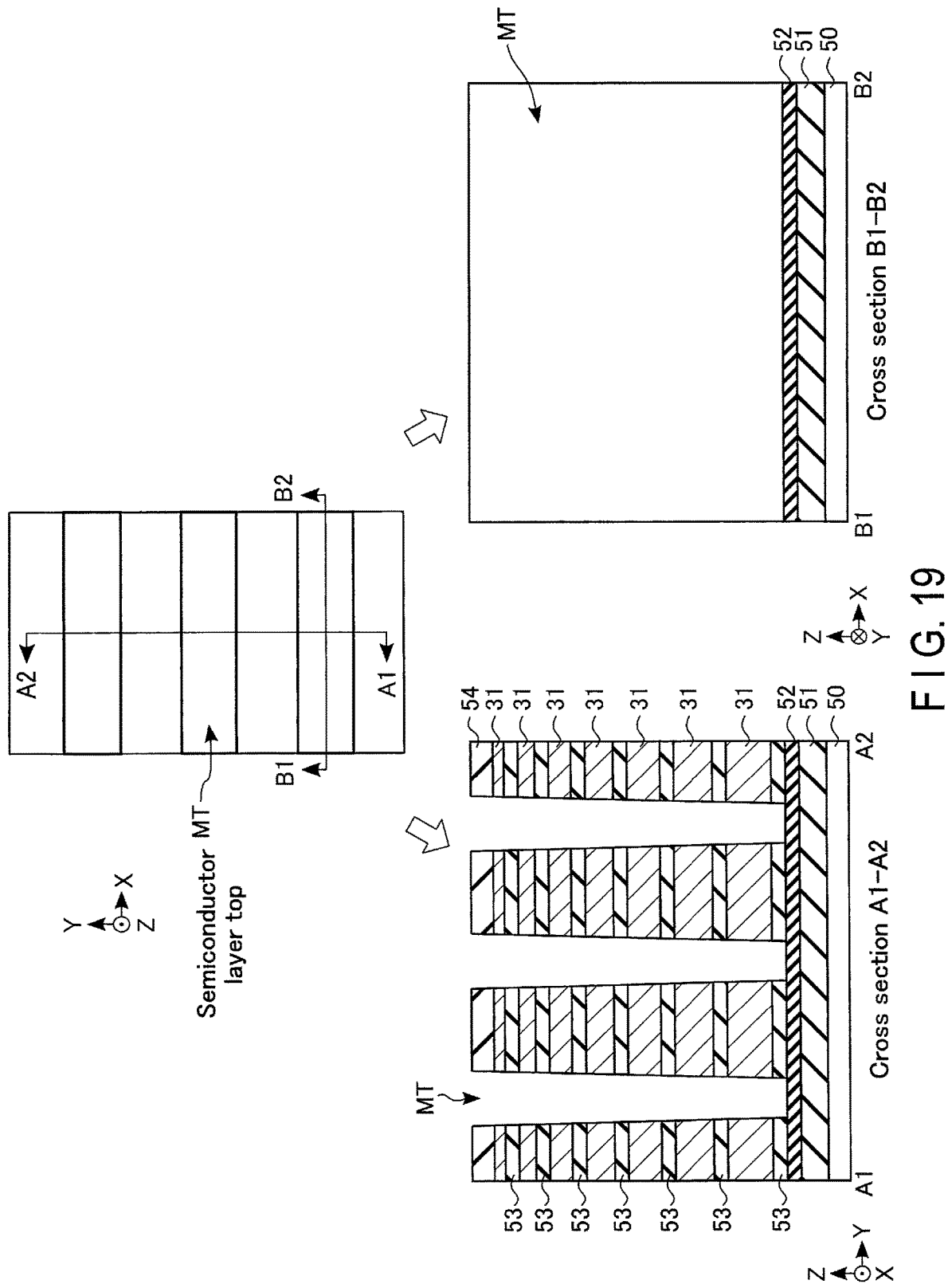

Next, as shown in FIG. 19, the memory trench MT, which passes through the insulating layer 54, the seven semiconductor layers 31, and the seven insulating layers 53 to reach the insulating layer 52 at its bottom, is formed by dry etching. The memory trench MT is formed into a tapered shape (or trapezoidal shape) from the opening to the bottom, in which the memory trench MT is wider on the opening side and narrower on the bottom side in the Y-directional cross-section (cross section A1-A2).

The subsequent manufacturing steps shown in FIGS. 20 to 23 are the same as those shown in FIGS. 12 to 15 in the first embodiment.

Figure 20:
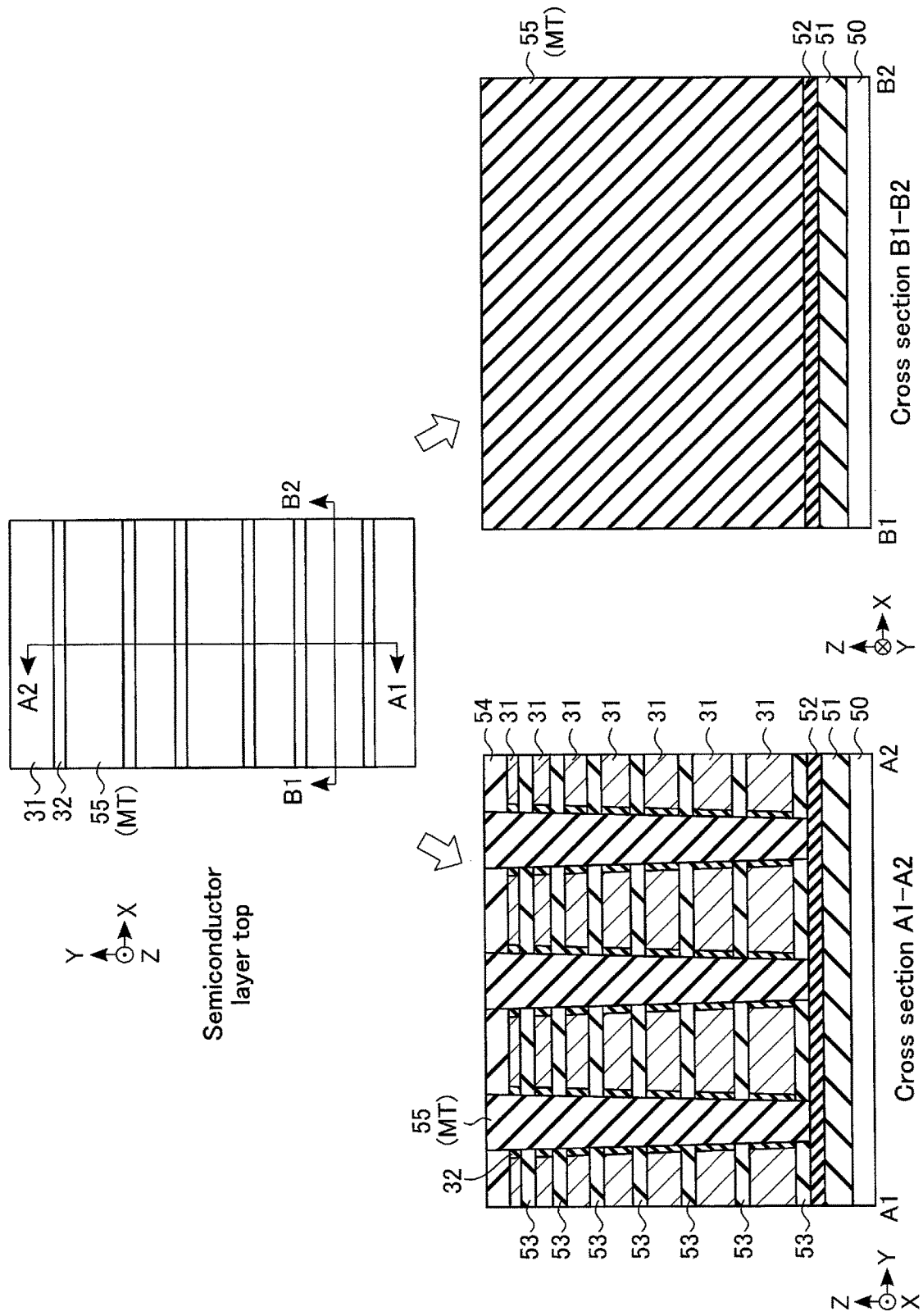

Specifically, as shown in FIG. 20, the semiconductor layers 31 are each partly removed from the side surface of the memory trench MT, and the insulating layer 32 is formed in the regions from which the semiconductor layers 31 have been removed. Furthermore, the insulating layer 55 is formed in the memory trench MT.

Figure 21:
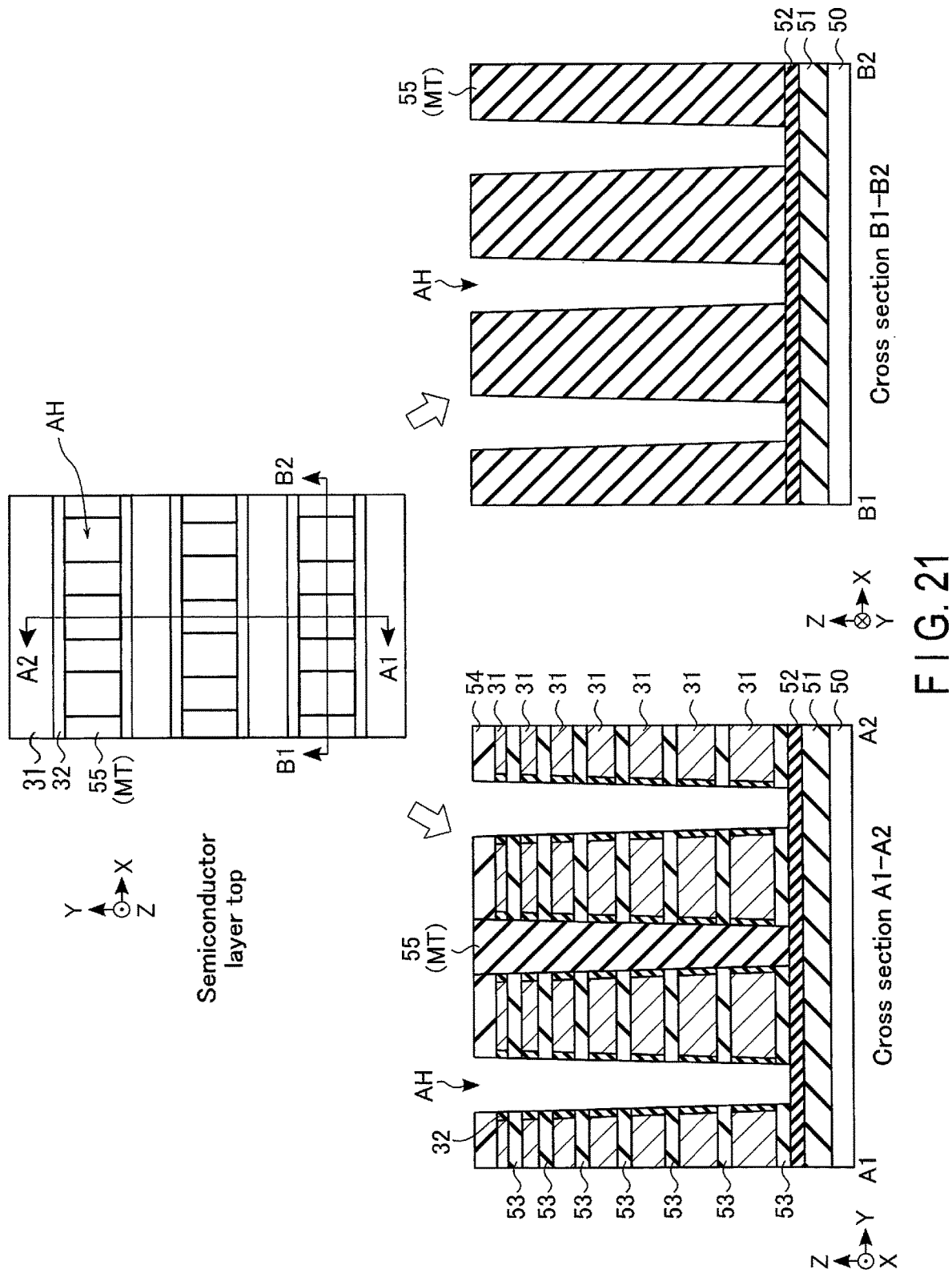
Figure 22:
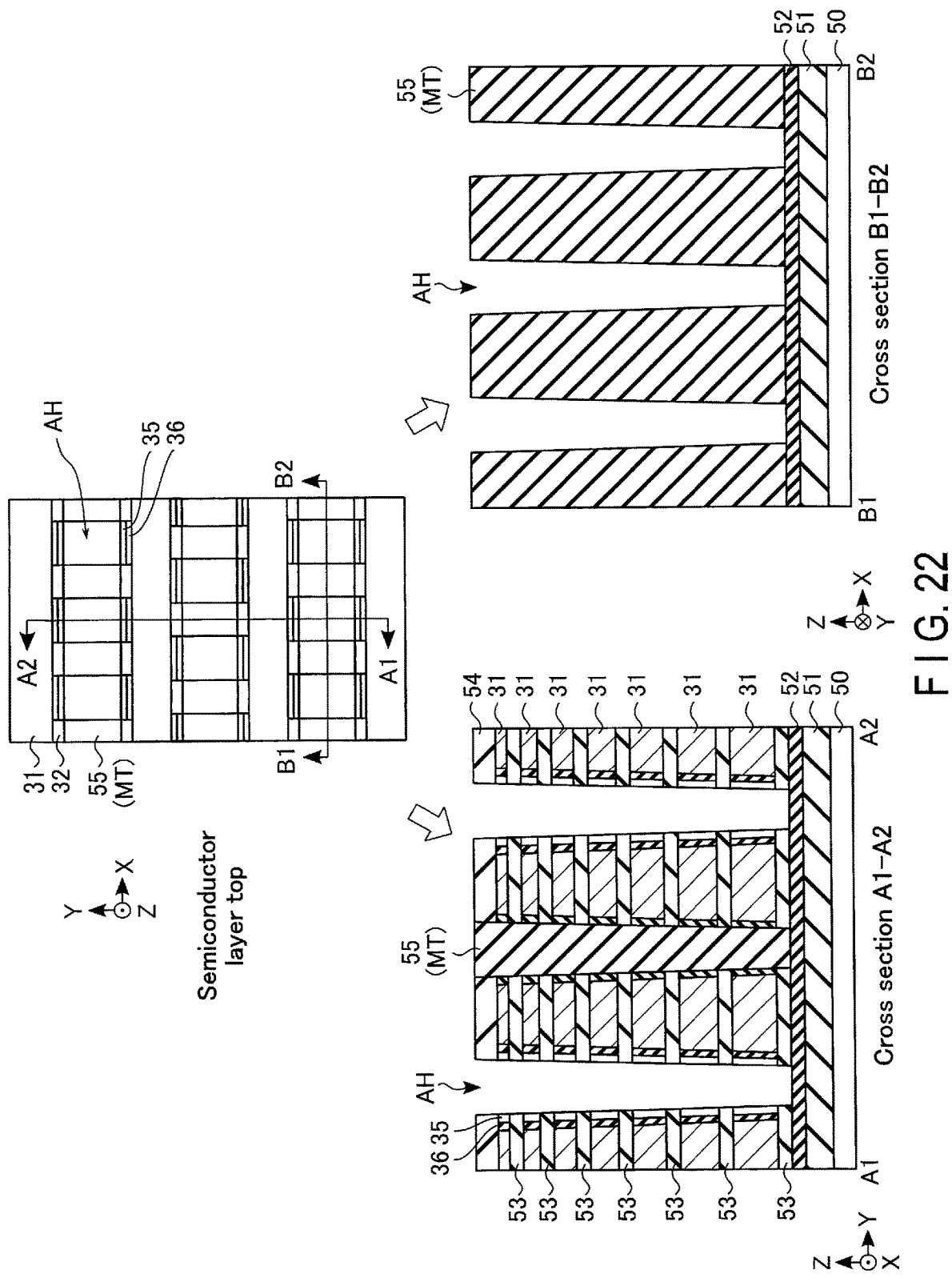

As shown in FIG. 21, the insulating layer 55 is partly removed by dry etching, thereby forming a hole AH. As shown in FIG. 22, the tunnel insulating layer 36 and the charge storage layer 35 are formed on the Y-directional side surfaces of the hole AH.

Figure 23:
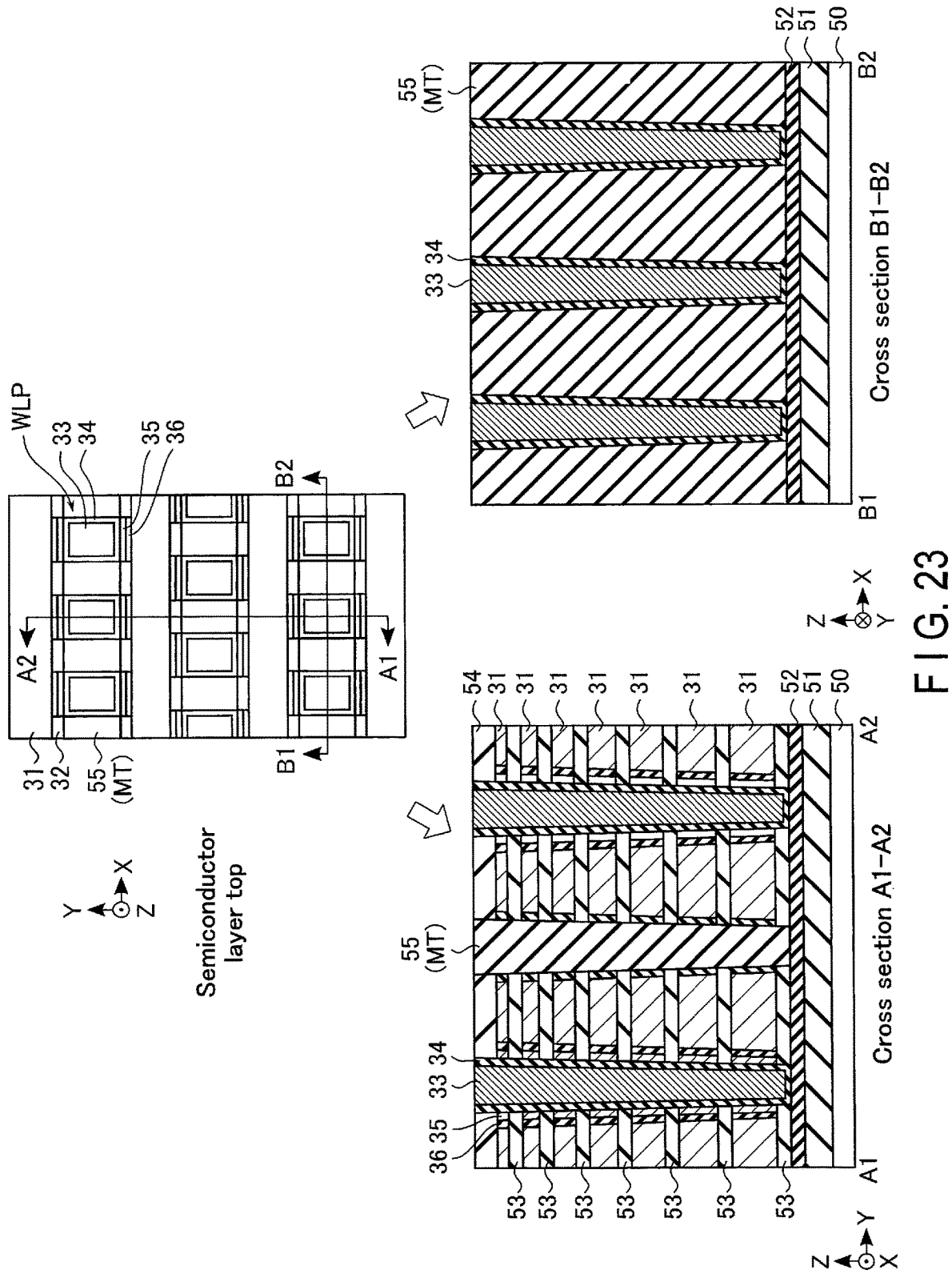

As shown in FIG. 23, the insulating layer 34 is formed on the side and bottom surfaces of the hole AH, and the conductive layer 33 is then formed in the hole AH. The memory cell region shown in FIG. 23 is formed by the above-described steps.

2.3 Advantages of Second Embodiment

The semiconductor memory device of the second embodiment can improve reliability of the read operation as in the first embodiment. Advantages of the second embodiment will be described below.

In the structure in which a plurality of semiconductor layers 31 extending in the X direction and word line pillars WLP extending in the Z direction to intersect the semiconductor layers 31 are provided above a semiconductor substrate 50, as in the first embodiment, the X-directional width (word line length) Lg of the conductive layer 33 in each word line pillar WLP tends to be smaller on the lower layer side than on the upper layer side, and the X-directional distance Ld between word line pillars WLP tends to be larger on the lower layer side than on the upper layer side, depending on the processing condition of the holes AH. In addition, when memory trenches MT are formed in a structure in which a plurality of semiconductor layers 31 are stacked with insulating layers 53 interposed therebetween, the Y-directional lengths tpoly of the semiconductor layers 31 may be larger on the lower layer side than on the upper layer side, depending on the processing condition. As the Y-directional length tpoly of a semiconductor layer 31 increases, the distance between word line pillars WLP on the both sides of the semiconductor layer 31 in the Y direction increases, and the back-gate effect from the word line pillar WLP to which the read voltage is applied and the word line pillar WLP arranged on the other side of the semiconductor layer 31 decreases. Therefore, there arises a concern about a change in the threshold voltages of a memory cell transistor MC, and a decrease in the cell current that flows through a memory cell transistor MC on the lower layer side when a word line voltage (control gate voltage) is applied thereto. This may cause deterioration in reliability of the read operation in the semiconductor memory device.

In the above-described first embodiment, the decrease in the cell current is suppressed by adjusting the thickness of each semiconductor layer 31 in accordance with the X-directional width (gate length of each memory cell transistor MC) Lg of the conductive layer 33. In the second embodiment, the thickness of each semiconductor layer 31 is adjusted in consideration of the Y-directional length tpoly of the semiconductor layer 31 or the Y-directional width tgate of the conductive layer 33 which runs counter to the length tpoly, in addition to the X-directional width Lg of the conductive layer 33. Namely, the decrease in the cell current is suppressed by adjusting the thickness of each semiconductor layer 31 in accordance with the X-directional width Lg of the conductive layer 33 and the Y-directional length tpoly of the semiconductor layer 31. Specifically, as Lg/tpoly decreases, i.e., as Lg×tgate decreases, the thickness of the semiconductor layer 31 is increased, which can increase the Z-directional length of the channel layer formed in the semiconductor layer 31, and can lower the resistance between gates of memory cell transistors MC. Accordingly, a decrease in the cell current in each memory cell transistor MC on the lower layer side can be suppressed.

The semiconductor memory device of the second embodiment has a configuration in which: the thickness h1 of a first semiconductor layer 31 on the lower layer side is larger than the thickness hn of a second semiconductor layer 31 on the upper layer side, i.e., h1>hn is satisfied; and each word line pillar WLP has a first portion intersecting the first semiconductor layer 31 on the lower layer side and a second portion intersecting the second semiconductor layer 31 on the upper layer side, and Lg1/tpoly1<Lgn/tpolyn is satisfied, where an X-directional first width of the first portion is Lg1(L1), an X-directional second width of the second portion is Lgn (L2), the Y-directional length of the first semiconductor layer 31 on the lower layer side is tpoly1(P1), and the Y-directional length of the second semiconductor layer 31 on the upper layer side is tpolyn(P2). In addition, the semiconductor memory device of the second embodiment has a configuration in which Lg1×tgate1<Lgn×tgaten is satisfied, where the Y-directional width of the conductive layer 33 in the first portion is tgate1 and the Y-directional width of the conductive layer 33 in the second portion is tgaten.

The above configurations can make the Z-directional length of the channel layer formed in the semiconductor layer 31 on the lower layer side larger than that in the semiconductor layer 31 on the upper layer side, and can lower the resistance between gates of memory cell transistors MC on the lower layer side. Accordingly, a decrease in the cell current in each memory cell transistor MC on the lower layer side can be suppressed, and reliability of the read operation can be improved. Furthermore, reliability of the write operation and erase operation can be improved.

3. Third Embodiment

Next, a semiconductor memory device according to a third embodiment will be described. Described in the third embodiment is a case where a plurality of semiconductor layers 31 stacked above the semiconductor substrate 50 constitute a first group on the lower layer side and a second group on the upper layer side, and the thickness of the semiconductor layers 31 in the first group is larger than the thickness of the semiconductor layers 31 in the second group. The other circuit configuration, overall configuration, layout configuration, and cross-sectional structure are the same as those of the first embodiment. In the third embodiment, points different from the first embodiment will be mainly described.

3.1 Cross-Sectional Structure of Memory Cell Region

Figure 24:
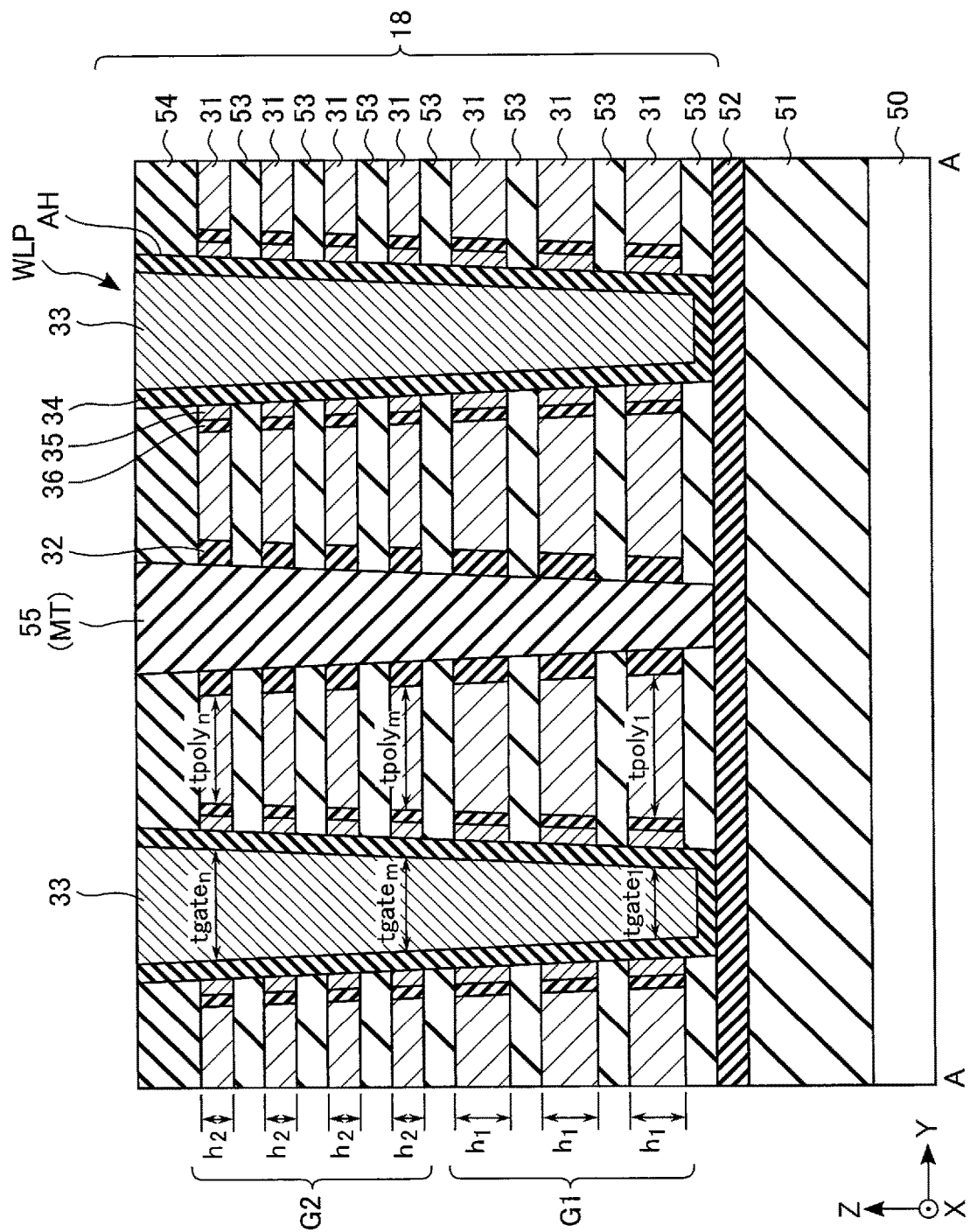
FIG. 24 is a cross-sectional view of a memory cell region in a third embodiment, taken along line A-A.
Figure 25:
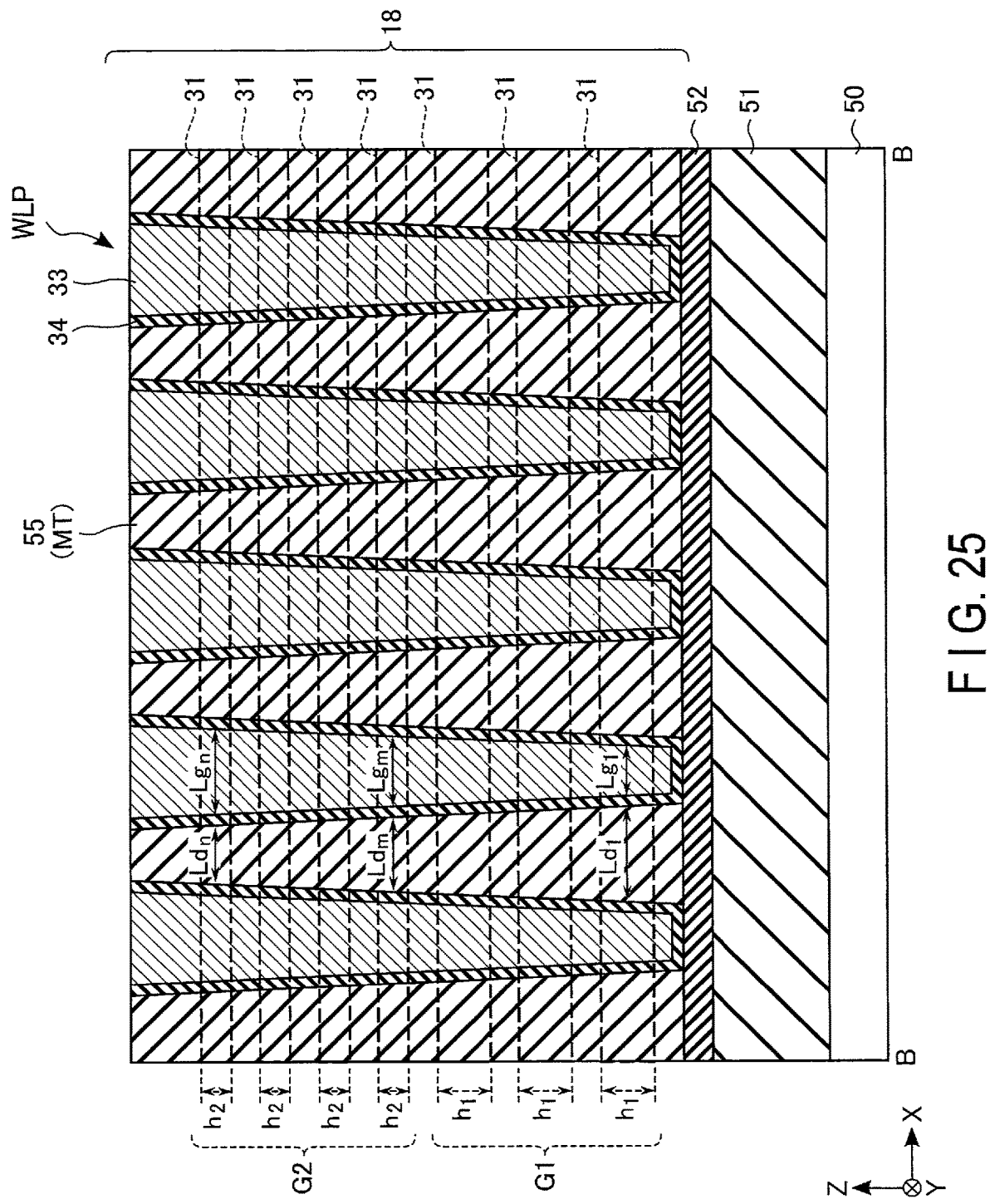
FIG. 25 is a cross-sectional view of the memory cell region in the third embodiment, taken along line B-B.

A cross-sectional structure of the memory cell region in the memory cell array 18 will be described with reference to FIGS. 24 and 25. FIG. 24 is a cross-sectional view taken along line A-A in FIG. 7, showing a Y-directional cross section of the memory cell region in the third embodiment. FIG. 25 is a cross-sectional view taken along line B-B in FIG. 7, showing an X-directional cross section of the memory cell region in the third embodiment.

In the third embodiment, as shown in FIG. 24, a plurality of semiconductor layers 31 stacked above the semiconductor substrate 50 constitute a first group G1 on the lower layer side and a second group G2 on the upper layer side with respect to the first group G1. The thickness h1 of the semiconductor layers 31 in the first group G1 is larger than the thickness h2 of the semiconductor layers 31 in the second group G2. The thicknesses h1 of the semiconductor layers 31 in the first group G1 are approximately the same, and the thicknesses h2 of the semiconductor layers 31 in the second group G2 are approximately the same.

As shown in FIGS. 24 and 25, the X-directional width (word line length) Lg of the conductive layer 33, the distance Ld between word line pillars WLP, the Y-directional length tpoly of each semiconductor layer 31, and the Y-directional width (word line width) tgate of the conductive layer 33 are the same as those in the second embodiment. Namely, the relationship between the X-directional widths (word line lengths) Lg of the conductive layer 33 is expressed as Lg1<Lgm<Lgn. The relationship between the X-directional distances Ld between word line pillars WLP is expressed as Ld1>Ldm>Ldn. The relationship between the Y-directional lengths tpoly of semiconductor layers 31 is expressed as tpoly1>tpolym>tpolyn. The relationship between the Y-directional widths (word line widths) tgate of the conductive layer 33 are expressed as tgate1<tgatem<tgaten.

As described above, the memory cell region of the third embodiment has a configuration in which: the thickness h1 of the semiconductor layers 31 in the first group G1 on the lower layer side is larger than the thickness h2 of the semiconductor layers 31 in the second group G2 on the upper layer side (h1>h2), the X-directional width (word line length) Lg1 of the conductive layer 33 on the lower layer side is smaller than the X-directional width Lgn of the conductive layer 33 on the upper layer side (Lg1<Lgm<Lgn), the distance Ld1 between word line pillars WLP on the lower layer side is larger than the distance Ldn between word line pillars WLP on the upper layer side (Ld1>Ldm>Ldn), and the Y-directional length tpoly1 of a semiconductor layer 31 on the lower layer side is larger than the Y-directional length tpolyn of a semiconductor layer 31 on the upper layer side (tpoly1>tpolym>tpolyn).

3.2 Method for Manufacturing Semiconductor Memory Device

Figure 26:
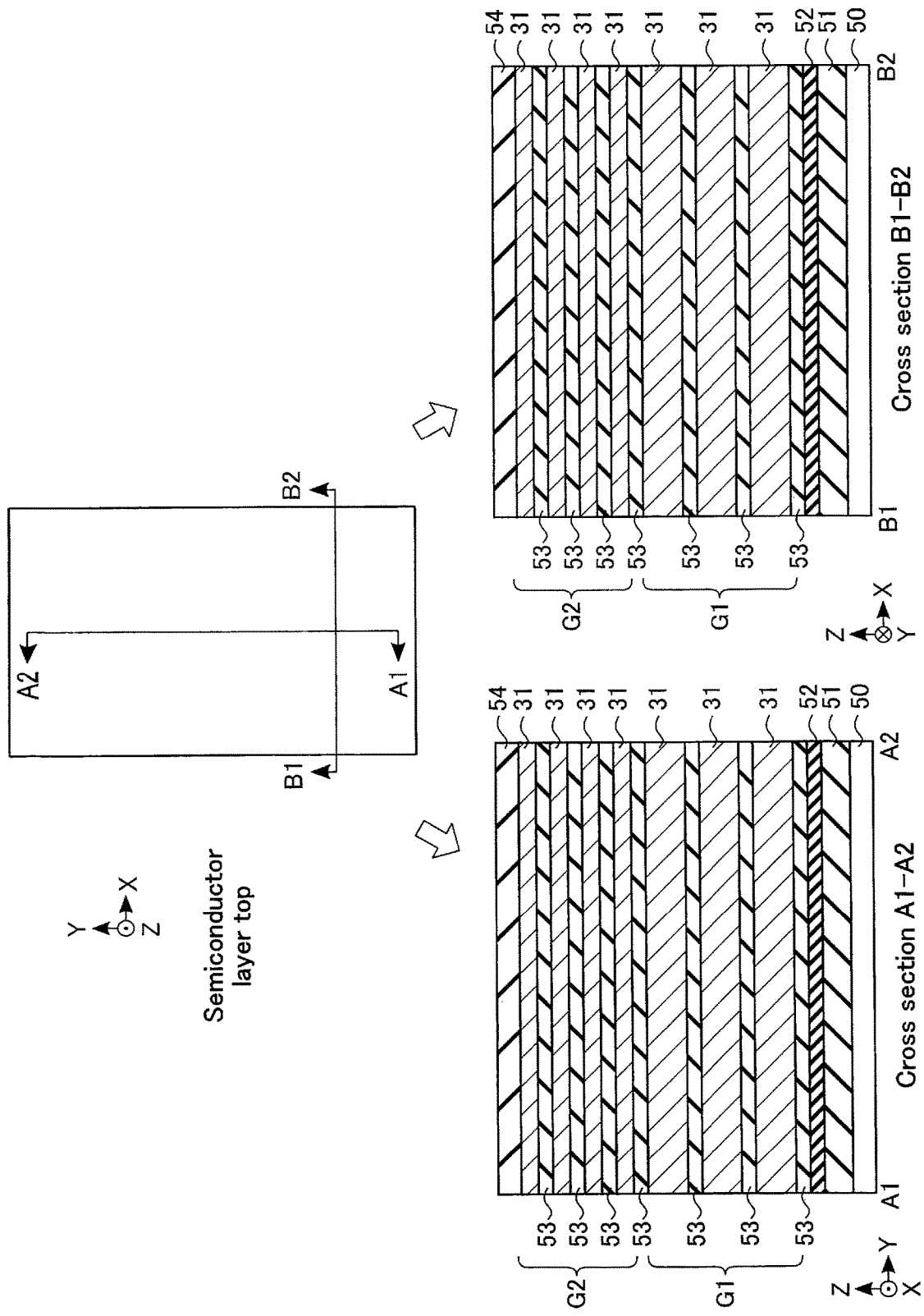
FIG. 26 is a diagram showing a method for manufacturing the memory cell region in the third embodiment.

Next, a method for manufacturing the memory cell region in the semiconductor memory device of the third embodiment will be described. FIG. 26 is a diagram showing a method for manufacturing the memory cell region in the third embodiment.

First, as shown in FIG. 26, the insulating layers 51 and 52 are sequentially stacked on the semiconductor substrate 50 and, for example, the seven insulating layers 53 and seven semiconductor layers 31 are alternately stacked on the insulating layer 52. The semiconductor layers 31 in the first group G1 on the lower layer side are formed to have the thickness h1, and the semiconductor layers 31 in the second group G2 on the upper layer side are formed to have the thickness h2, which is smaller than the thickness h1, by, for example, CVD. The insulating layer 54 is further formed on the uppermost semiconductor layer 31.

The subsequent manufacturing steps are the same as those shown in FIGS. 19 to 23 in the second embodiment; therefore, drawings and descriptions of the steps are omitted.

3.3 Advantages of Third Embodiment

The semiconductor memory device according to the third embodiment can improve reliability of the read operation. Advantages of the third embodiment will be described below.

In the third embodiment, the thickness h1 of the semiconductor layers 31 in the first group G1 on the lower layer side is larger than the thickness h2 of the semiconductor layers 31 in the second group G2 on the upper layer side, i.e., h1>h2 is satisfied. This configuration can make the Z-directional length of the channel layer formed in each semiconductor layer 31 in the first group G1 on the lower layer side larger than that in each semiconductor layer 31 in the second group G2 on the upper layer side, and can make the resistance between gates of memory cell transistors MC in the first group G1 on the lower layer side lower than that between gates of memory cell transistors MC in the second group G2 on the upper layer side. Accordingly, a decrease in the cell current in each memory cell transistor MC in the first group G1 on the lower layer side can be suppressed, and reliability of the read operation can be improved. Furthermore, reliability of the write operation and erase operation can be improved.

Described in the third embodiment is the case where there are two groups, i.e., the first group G1 and the second group G2; however, a plurality of semiconductor layers 31 may be grouped into any number of groups.

4. Fourth Embodiment

Next, a semiconductor memory device according to a fourth embodiment will be described. Described in the first to third embodiments are cases where the dimensions of each word line pillar WLP gradually decrease from the upper layer portion to the lower layer portion. Described in the fourth embodiment is a case where each word line pillar WLP is the thickest in a portion lower than the portion corresponding to the uppermost semiconductor layer 31 and gradually becomes thinner from this portion to the lower layer portion. In the fourth embodiment, points different from the second embodiment will be mainly described.

4.1 Cross-Sectional Structure of Memory Cell Region

Figure 27:
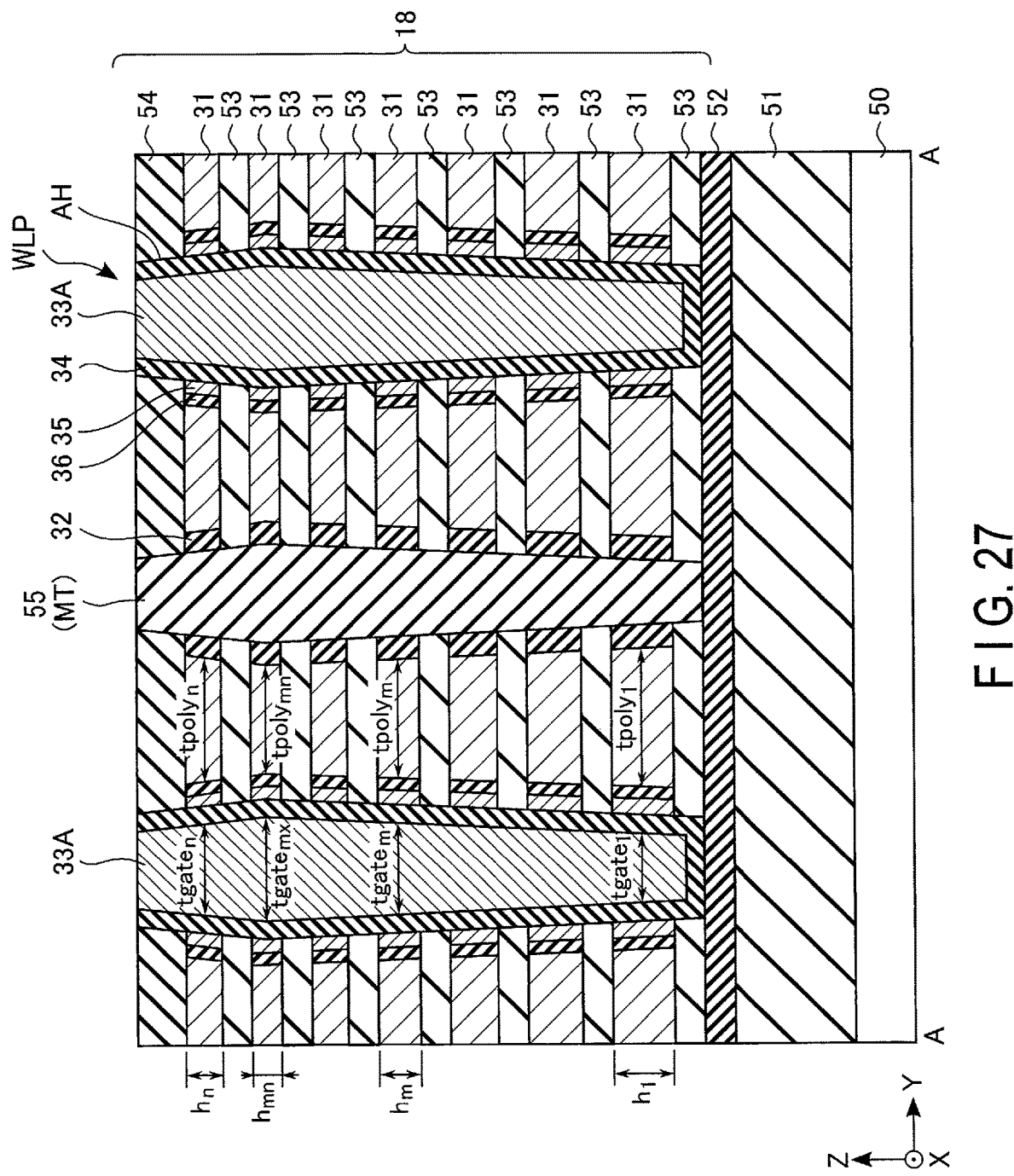
FIG. 27 is a cross-sectional view of a memory cell region in a fourth embodiment, taken along line A-A.

A cross-sectional structure of the memory cell region in the memory cell array 18 will be described with reference to FIGS. 27 and 28. FIG. 27 is a cross-sectional view taken along line A-A in FIG. 7, showing a Y-directional cross section of the memory cell region in the fourth embodiment. FIG. 28 is a cross-sectional view taken along line B-B in FIG. 7, showing an X-directional cross section of the memory cell region in the fourth embodiment.

As shown in FIGS. 27 and 28, each word line pillar WLP includes a conductive layer 33A and insulating layer 34 extending in the Z direction. The conductive layer 33A includes an upper layer portion corresponding to the uppermost semiconductor layer 31, a middle portion corresponding to a middle semiconductor layer 31, a lower layer portion corresponding to the lowermost semiconductor layer 31, and a portion with the largest X-directional and Y-directional widths being on the lower layer side with respect to the upper layer portion and being on the upper layer side with respect to the middle portion. Hereinafter, the portion with the largest X-directional and Y-directional widths in the conductive layer 33A will also be simply referred to as a largest portion.

As shown in FIG. 28, Lg1 is assigned to the X-directional width (word line length) of the lower layer portion, Lgm is assigned to the X-direction width of the middle portion, Lgmx is assigned to the X-directional width of the largest portion, and Lgn is assigned to the X-directional width of the upper layer portion in the conductive layer 33A. When the X-directional widths Lg1, Lgm, Lgmx, and Lgn of the conductive layer 33A are not distinguished from one another, each length will be referred to as a width Lg.

The X-directional width Lg of the conductive layer 33A gradually increases from the lower layer portion with Lg1 through the middle portion with Lgm to the largest portion with Lgmx, and gradually decreases from the largest portion to the upper layer portion with Lgn. Namely, the relationship between the X-directional widths Lg1, Lgm, Lgmx, and Lgn of the conductive layer 33A is expressed as Lg1<Lgm<Lgmx and Lgmx>Lgn.

In addition, Ld1 is assigned to the distance between word line pillars WLP adjacent to each other in the X direction corresponding to the lower layer portion, Ldm is assigned to the distance between word line pillars WLP adjacent to each other in the X direction corresponding to the middle portion, Ldmn is assigned to the distance between word line pillars WLP adjacent to each other in the X direction corresponding to the largest portion, and Ldn is assigned to the distance between word line pillars WLP adjacent to each other in the X direction corresponding to the upper layer portion in the cross-sectional structure shown in FIG. 28. When the distances Ld1, Ldm, Ldmn, and Ldn between word line pillars WLP are not distinguished from one another, each distance will be referred to as a distance Ld.

The X-directional distance Ld between word line pillars WLP gradually decreases from the distance Ld1 corresponding to the lower layer portion through the distance Ldm corresponding to the middle portion to the distance Ldmn corresponding to the largest portion, and gradually increases from the distance Ldmn to the distance Ldn corresponding to the upper layer portion. Namely, the relationship between the X-directional distances Ld1, Ldm, Ldmn, and Ldn between word line pillars WLP is expressed as Ld1>Ldm>Ldmn and Ldmn<Ldn.

Moreover, as shown in FIG. 27, tpoly1 is assigned to the Y-directional length of the semiconductor layer 31 between the word line pillar WLP and the memory trench MT (or insulating layer 55) corresponding to the lower layer portion, tpolym is assigned to the Y-directional length of the semiconductor layer 31 corresponding to the middle portion, tpolymn is assigned to the Y-directional length of the semiconductor layer 31 corresponding to the largest portion, and tpolyn is assigned to the Y-directional length of the semiconductor layer 31 corresponding to the upper layer portion. When the Y-directional lengths tpoly1, tpolym, tpolymn, and tpolyn of the semiconductor layer 31 are not distinguished from one another, each length will be referred to as a length tpoly.

The Y-directional lengths tpoly of the semiconductor layers 31 gradually decrease from the length tpoly1 corresponding to the lower layer portion through the length tpolym corresponding to the middle portion to the length tpolymn corresponding to the largest portion, and gradually increase from the length tpolymn to the length tpolyn corresponding to the upper layer portion. The relationship between the Y-directional lengths tpoly1, tpolym, tpolymn, and tpolyn of the semiconductor layers 31 is expressed as tpoly1>tpolym>tpolymn and tpolymn<tpolyn.

As shown in FIG. 27, tgate1 is assigned to the Y-directional width (word line width) of the lower layer portion, tgatem is assigned to the Y-directional width of the middle portion, tgatemx is assigned to the Y-directional width of the largest portion, and tgaten is assigned to the Y-directional width of the upper layer portion in the conductive layer 33A. When the Y-directional widths tgate1, tgatem, tgatemx, and tgaten of the conductive layer 33A are not distinguished from one another, each width will be referred to as a width tgate.

The Y-directional width tgate of the conductive layer 33A gradually increases from the lower layer portion with tgate1 through the middle portion with tgatem to the largest portion with tgatemx, and gradually decreases from the largest portion to the upper layer portion with tgaten. Namely, the relationship between the Y-directional widths tgate1, tgatem, tgatemx, and tgaten of the conductive layer 33A is expressed as tgate1<tgatem<tgatemx and tgatemx>tgaten.

Described herein is the case where the conductive layer 33A has the largest X-directional width Lgmx and the largest Y-directional width tgatemx at approximately the same level from the semiconductor substrate 50; however, the levels of the largest width portions may not be the same.

4.2 Method for Manufacturing Semiconductor Memory Device

Next, a method for manufacturing the memory cell region in the semiconductor memory device of the fourth embodiment will be described. FIGS. 29 to 34 are diagrams showing a method for manufacturing the memory cell region in the fourth embodiment.

Figure 29:
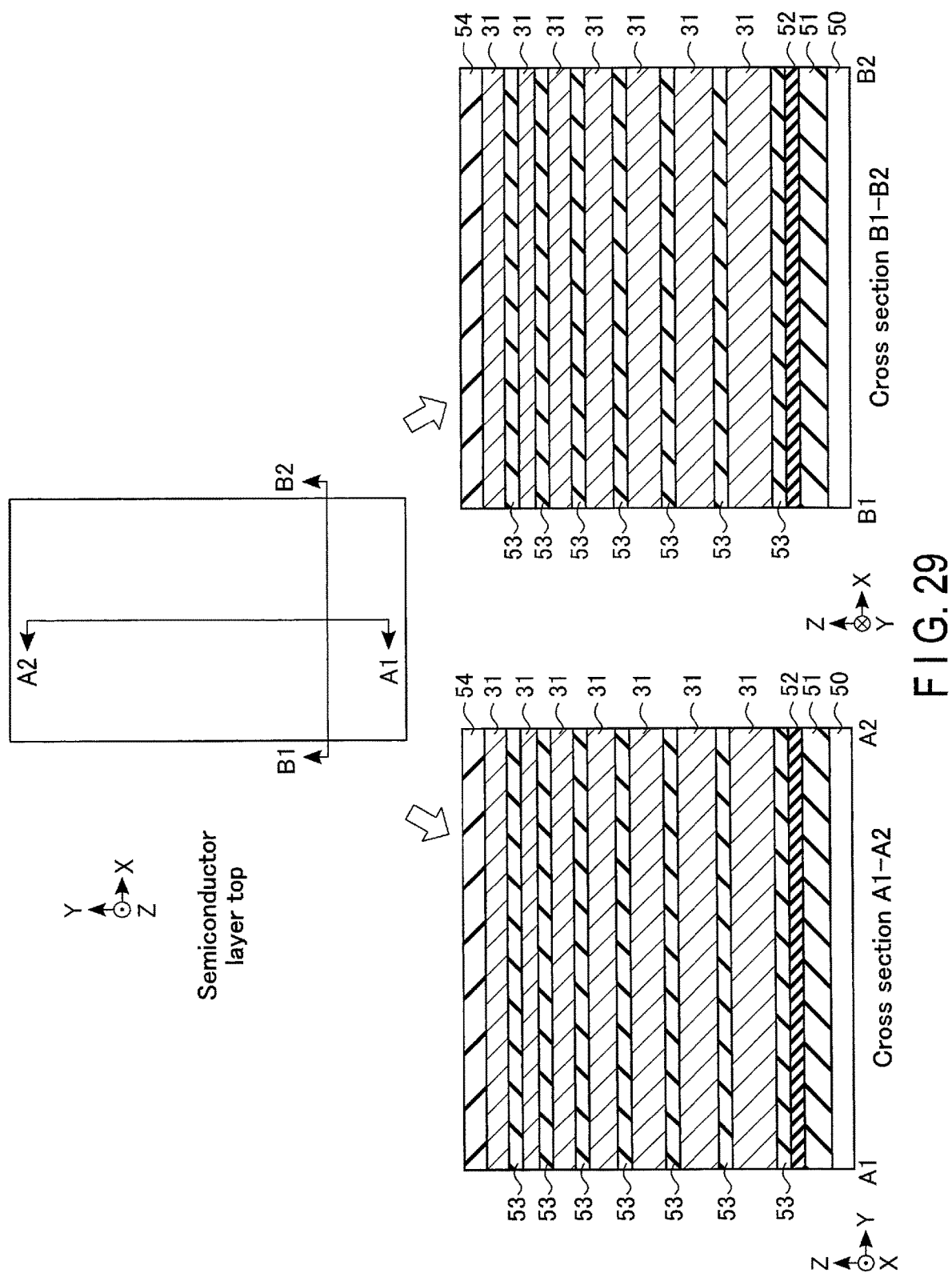

First, as shown in FIG. 29, the insulating layers 51 and 52 are sequentially stacked on the semiconductor substrate 50. Next, for example, the seven semiconductor layers 31 are formed on the insulating layer 52 to gradually become thinner in the Z direction from the semiconductor layer 31 corresponding to the lower layer portion to the semiconductor layer 31 corresponding to the largest portion, and to gradually become thicker in the Z direction from the semiconductor layer 31 corresponding to the largest portion to the semiconductor layer 31 corresponding to the upper layer portion. The insulating layer 54 is further formed on the uppermost semiconductor layer 31.

Figure 30:
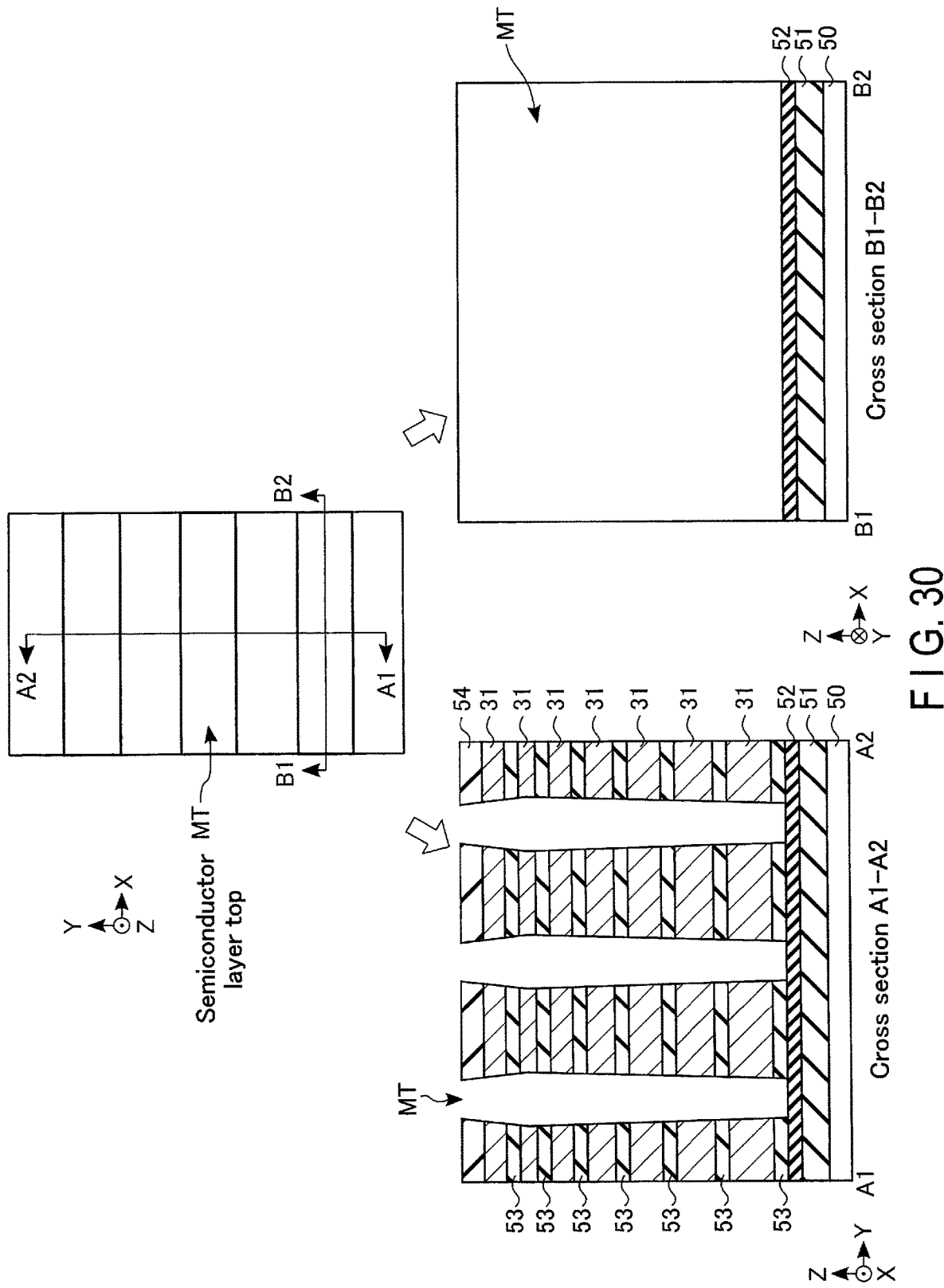

Next, as shown in FIG. 30, the memory trench MT, which passes through the insulating layer 54, the seven semiconductor layers 31, and the seven insulating layers 53 to reach the insulating layer 52 at its bottom, is formed by, for example, dry etching. The memory trench MT is formed to be widest in the portion corresponding to the largest portion lower than the portion corresponding to the upper layer portion of the semiconductor layer 31 (or the portion corresponding to the uppermost semiconductor layer 31), and to gradually become narrower from the portion corresponding to the largest portion to the portion corresponding to the lower layer portion in the Y-directional cross section (cross section A1-A2).

Figure 31:
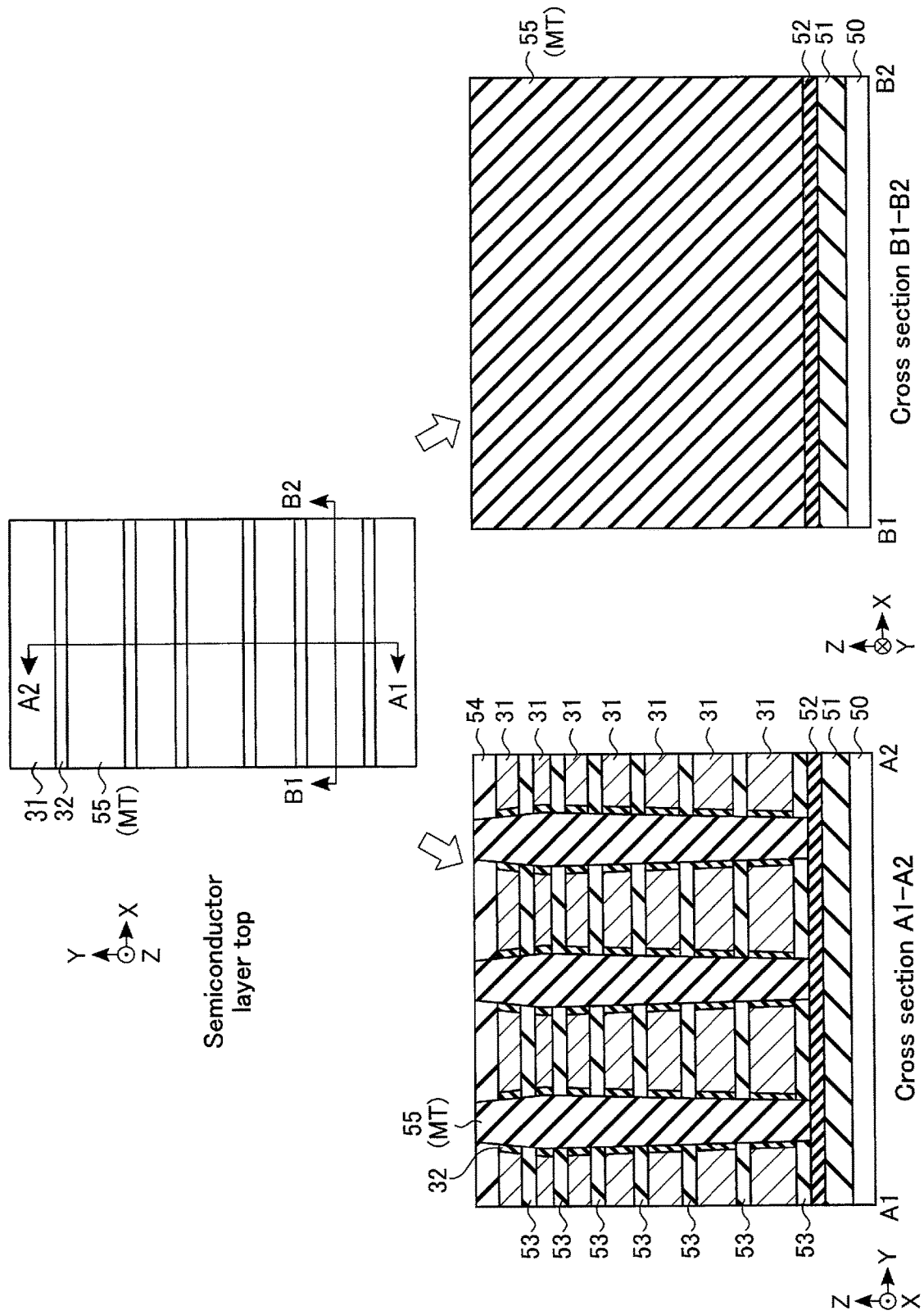

Next, as shown in FIG. 31, the semiconductor layers 31 are each partly removed from the side surface of the memory trench MT, and the insulating layer 32 is formed in the regions from which the semiconductor layers 31 have been removed. Furthermore, the insulating layer 55 is formed in the memory trench MT.

Figure 32:
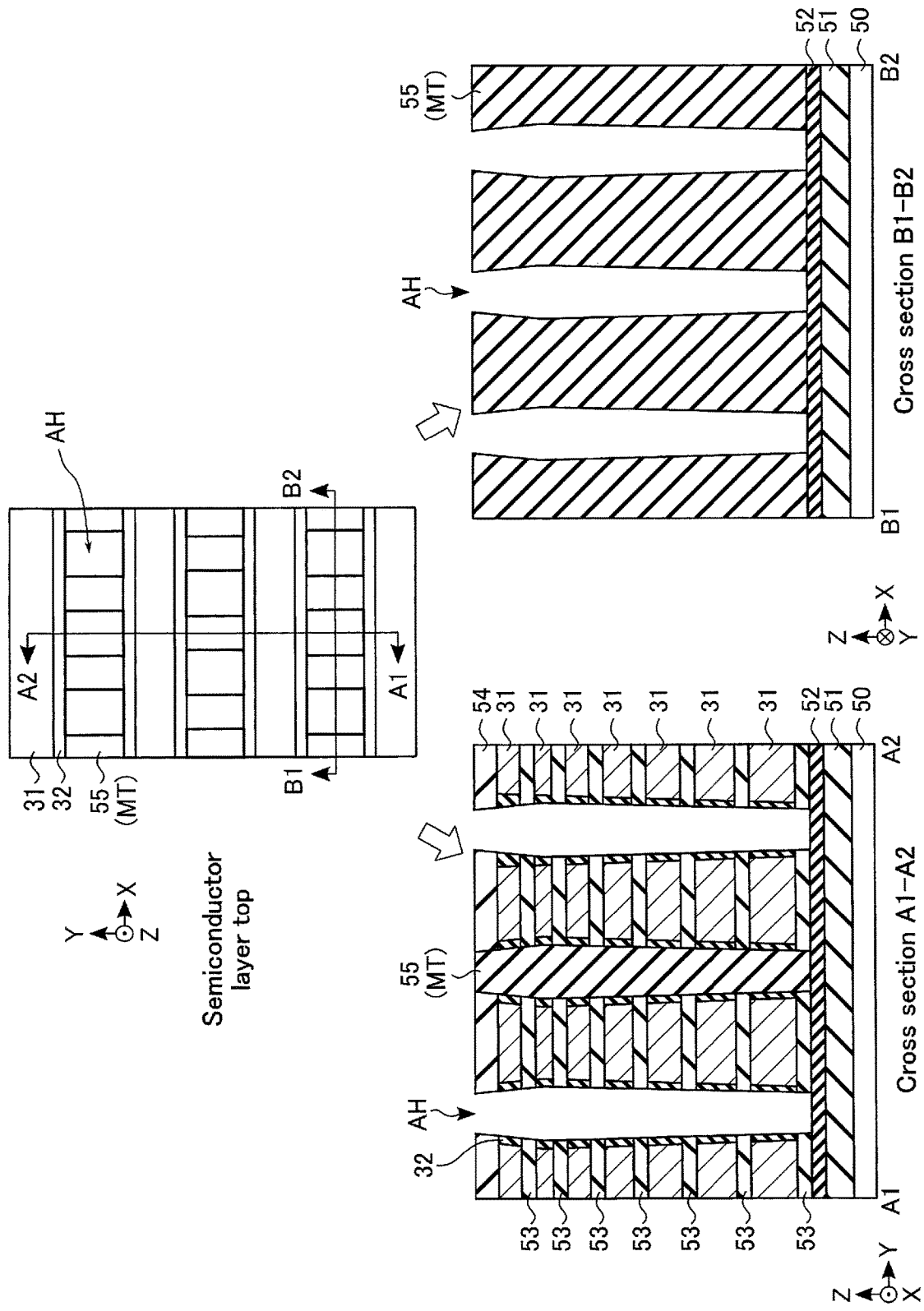

Next, as shown in FIG. 32, the insulating layer 55 is partly removed by dry etching, thereby forming a hole AH. The hole AH is formed to be widest in the portion corresponding to the largest portion lower than the portion corresponding to the upper layer portion of the semiconductor layer 31 (or the portion corresponding to the uppermost semiconductor layer 31), and to gradually become narrower from the portion corresponding to the largest portion to the portion corresponding to the lower layer portion in the X-directional cross section (cross section B1-B2). In addition, as described above, the hole AH is already formed, in the step of forming the memory trench MT, to be widest in the portion corresponding to the largest portion lower than the portion corresponding to the upper layer portion of the semiconductor layer 31, and to gradually become narrower from the portion corresponding to the largest portion to the portion corresponding to the lower layer portion in the Y-directional cross section (cross section A1-A2).

Shown in FIG. 32 is the case where the hole AH has the largest X-directional width and the largest Y-directional width at the same distance (or same level) from the semiconductor substrate 50; however, since the cross section B1-B2 is formed in the step of forming the hole AH, and the cross-section A1-A2 is formed in a step of forming the memory trench MT, the hole AH may have the largest X-directional width and the largest Y-directional width at different distances from the semiconductor substrate 50.

Figure 34:
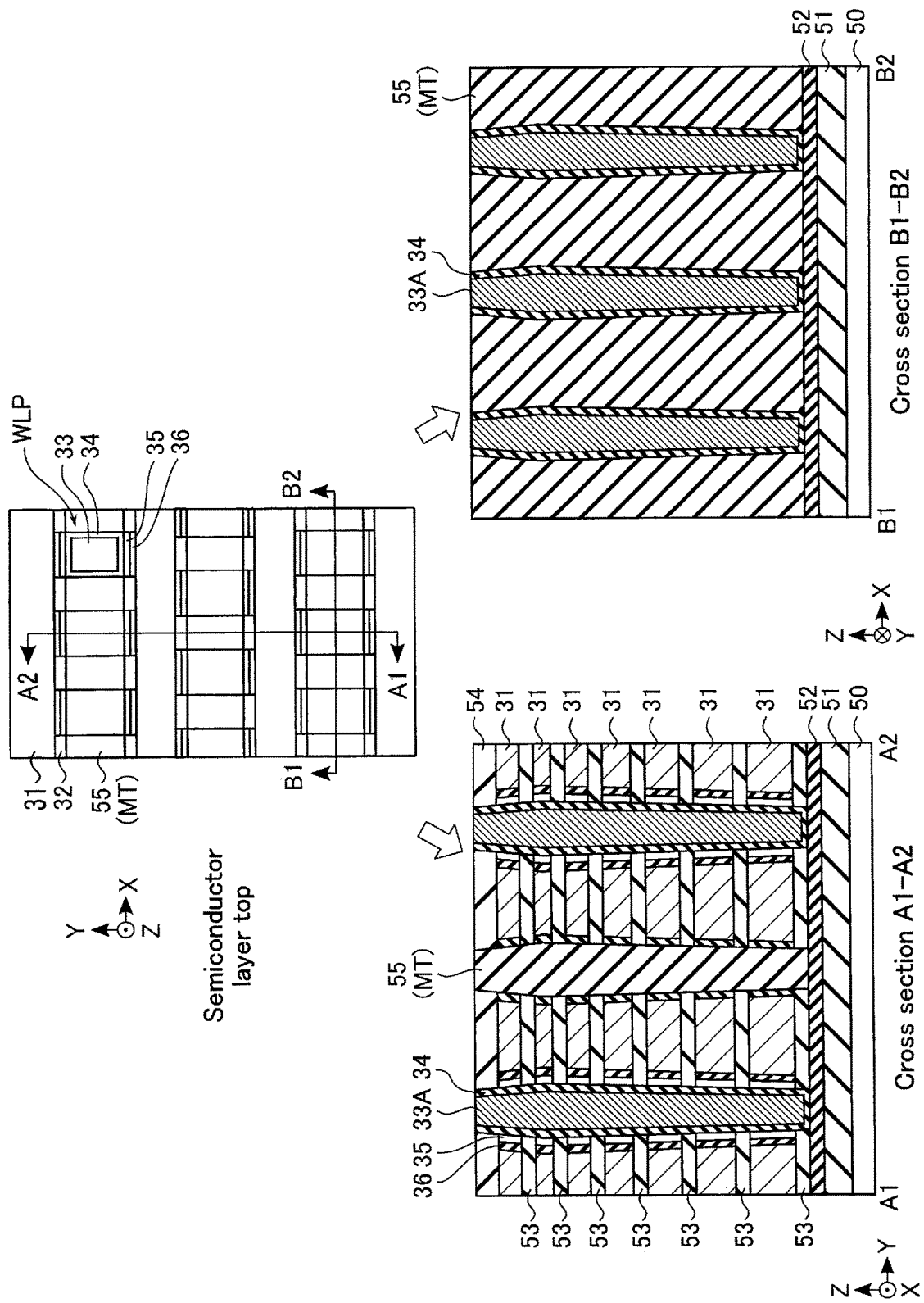

The subsequent manufacturing steps shown in FIGS. 33 to 34 are the same as those shown in FIGS. 14 and 15 in the first embodiment.

Specifically, as shown in FIG. 33, the tunnel insulating layer 36 and the charge storage layer 35 are formed on the side surface of the semiconductor layer 31 in the hole AH. Next, as shown in FIG. 34, the insulating layer 34 is formed on the side and bottom surfaces of the hole AH, and the conductive layer 33A is then formed in the hole AH. The memory cell region shown in FIG. 34 is formed by the above-described steps.

4.3 Advantages of Fourth Embodiment

The semiconductor memory device according to the fourth embodiment can improve reliability of the read operation. Advantages of the fourth embodiment will be described below.

In the fourth embodiment, as shown in FIGS. 27 and 28, the conductive layer 33A in the word line pillar WLP includes a largest portion between an upper layer portion corresponding to the uppermost semiconductor layer 31 and a middle portion corresponding to a middle semiconductor layer 31 (or a lower layer portion corresponding to the lowermost semiconductor layer 31). In this way, the word line pillar WLP may not be formed to gradually become thinner from the uppermost layer to the lowermost layer, but be formed to first gradually become thicker from the upper layer to the lower layer side, and then become thinner from the largest portion to the further lower layer side, depending on the processing conditions of the hole AH and memory trench MT.

In the semiconductor memory device of the fourth embodiment, the thickness hmn of the semiconductor layer 31 corresponding to the largest portion is smaller than the thicknesses hm and h1 of the semiconductor layers 31 corresponding to the middle portion and the lower layer portion, and smaller than the thickness hn of the semiconductor layer 31 corresponding to the upper layer portion, i.e., $hmn<hm<h1$ and $hmn<hn$ are satisfied. In addition, in the conductive layer 33A, the X-directional width Lgmx of the largest portion is larger than the X-directional widths Lgm and Lg1 of the middle portion and the lower layer portion, and is larger than the X-directional width Lgn of the upper layer portion, i.e., $Lgmx>Lgm>Lg1$ and $Lgmx>Lgn$ are satisfied. In a dimensionally opposite manner, the distance Ldmn between word pillars WLP corresponding to the largest portion is smaller than the distances Ldm and Ld1 between word line pillars WLP corresponding to the middle portion and the lower layer portion, and is smaller than the distance Ldn between word line pillars WLP corresponding to the upper layer portion, i.e., $Ldmn<Ldm<Ld1$ and $Ldmn<Ldn$ are satisfied. In addition, where the X-directional width of the conductive layer 33A is Lg, and the Y-directional length of each semiconductor layer 31 is tpoly, Lgmx/tpolymn of the largest portion is larger than Lgm/tpolym of the middle portion and Lg1/tpoly1 of the lower layer portion, and is larger than Lgn/tpolyn of the upper layer portion, i.e., $Lgmx/tpolymn>Lgm/tpolym>Lg1/tpoly1$, and $Lgmx/tpolymn>Lgn/tpolyn$ are satisfied.

In the fourth embodiment, when the X-directional widths of the conductive layer 33A have the relationship $Lgmx>Lgm>Lg1$ and $Lgmx>Lgn$ and the distances between word line pillars WLP adjacent to each other in the X direction has the relationship $Ldmn<Ldm<Ld1$ and $Ldmn<Ldn$, the thicknesses of the semiconductor layers 31 have the relationship $hmn<hm<h1$ and $hmn<hn$. Alternatively, when the X-directional widths Lg of the conductive layer 33A and the Y-directional lengths tpoly of the semiconductor layers 31 have the relationship $Lgmx/tpolymn>Lgm/tpolym>Lg1/tpoly1$ and $Lgmx/tpolymn>Lgn/tpolyn$, the thicknesses of the semiconductor layers 31 have the relationship $hmn<hm<h1$ and $hmn<hn$.

For example, when the X-directional width Lgmx of the largest portion of the conductive layer 33A is larger than the X-directional width Lgm of the middle portion, and is larger than the X-directional width Lgn of the upper portion, or the distance Ldmn between word line pillars WLP corresponding to the largest portion is smaller than the distance Ldm between word line pillars WLP corresponding to the middle portion, and is smaller than the distance Ldn between word line pillars WLP corresponding to the upper layer portion, even if the Y-directional length tpolymn of the semiconductor layer 31 corresponding to the largest portion is smaller than the Y-directional length tpolym of the semiconductor layer 31 corresponding to the middle portion, and is smaller than the Y-directional length tpolyn of the semiconductor layer 31 corresponding to the upper layer portion, the thickness hm of the semiconductor layer 31 corresponding to the middle portion and the thickness hn of the semiconductor layer 31 corresponding to the upper layer portion are larger than the thickness hmn of the semiconductor layer 31 corresponding to the largest portion.

The above configuration can make the Z-directional lengths of the channel layers formed in the semiconductor layers 31 corresponding to the middle portion and the upper layer portion larger than that in the semiconductor layer 31 corresponding to the largest portion, and can make the resistances between gates of memory cell transistors MC corresponding to the middle portion and the upper layer portion lower than that between gates of memory cell transistors MC corresponding to the largest portion. Accordingly, a decrease in the cell currents not only in the memory cell transistors MC on the lower layer side, but also in the memory cell transistors MC corresponding to the middle portion and the upper portion, can be suppressed, and reliability of the read operation can be improved. Furthermore, reliability of the write operation and erase operation can be improved.

The structure of the semiconductor memory device of the fourth embodiment is not limited to the structure in which the dimension of the word line pillar gradually changes in the Z direction depending on the processing condition. For example, the present embodiment can be applied to a structure in which a word line pillar is thicker in a middle portion between an upper layer portion and a lower layer portion than in the upper layer portion and the lower layer portion in a semiconductor memory device in which after a first word line pillar is formed, a second word line pillar is further formed above the first word line pillar.

5. Other Modifications, Etc.

In the third embodiment, a plurality of semiconductor layers 31 on the lower layer side constitute a first group, and a plurality of semiconductor layers 31 on the upper layer side constitute a second group, and the thicknesses of the semiconductor layers 31 are different between the groups; however, this configuration can be applied to the structure of the first embodiment in which only the X-directional dimension of the word line pillar WLP gradually increases from the lower layer side to the upper layer side.

The above configuration of the third embodiment can be applied to the fourth embodiment. In this case, for example, a plurality of semiconductor layers 31 on the lower layer side and the upper layer side including the semiconductor layer 31 corresponding to the largest portion of the conductive layer 33A constitute a first group, and a plurality of semiconductor layers 31 below the first group constitute a second group, and a plurality of semiconductor layers 31 above the first group constitute a third group, and the thicknesses of the semiconductor layers 31 are different among the first, second, and third groups.

In the fourth embodiment, the word line pillar WLP in both the X-directional and Y-directional dimensions has the largest portion between the lower layer portion and the upper layer portion, and the thickness of the semiconductor layer 31 corresponding to the largest portion is the smallest; however, even when the word line pillar WLP in only the X-directional dimension has the largest portion between the lower layer portion and the upper layer portion, and has approximately the same Y-directional dimension, the thickness of the semiconductor layer 31 corresponding to the largest portion may be the smallest.

While some embodiments have been described, those embodiments have been presented as examples, and are not intended to limit the scope of the invention. These embodiments can be implemented in various other forms, and various omissions, replacements, and changes can be made without departing from the spirit of the invention. The embodiments and their modifications are included in the scope and spirit of the invention and are included in the scope of the claimed inventions and their equivalents.

What is claimed is:

1. A semiconductor memory device comprising:
a first semiconductor layer extending in a first direction;

a second semiconductor layer stacked above the first semiconductor layer in a second direction intersecting the first direction, the second semiconductor layer extending in the first direction;

a first conductive layer intersecting the first semiconductor layer and the second semiconductor layer and extending in the second direction;

a first insulating layer provided between the first conductive layer and the first semiconductor layer;

a first charge storage layer provided between the first conductive layer and the first insulating layer; and a second insulating layer provided between the first conductive layer and the first charge storage layer, wherein the first conductive layer includes a first portion intersecting the first semiconductor layer and a second portion intersecting the second semiconductor layer, a first width of the first portion in the first direction is smaller than a second width of the second portion in the first direction, and a first thickness of the first semiconductor layer in the second direction is larger than a second thickness of the second semiconductor layer in the second direction.

2. The semiconductor memory device according to claim 1, further comprising:

a second conductive layer provided apart from the first conductive layer in the first direction, intersecting the first semiconductor layer and the second semiconductor layer, and extending in the second direction; and a third conductive layer intersecting the first semiconductor layer and the second semiconductor layer and extending in the second direction, the first semiconductor layer and the second semiconductor layer being interposed between the third conductive layer and the first and second conductive layers.

3. The semiconductor memory device according to claim 1, further comprising:

a first group of a plurality of semiconductor layers stacked in the second direction with the first semiconductor layer, the semiconductor layers in the first group each extending in the first direction; and a second group of a plurality of semiconductor layers stacked in the second direction with the second semiconductor layer, the semiconductor layers in the second group being apart from the semiconductor layers in the first group and each extending in the first direction, wherein the first conductive layer intersects the semiconductor layers in the first group and the semiconductor layers in the second group, and the semiconductor layers in the first group have the first thickness, and the semiconductor layers in the second group have the second thickness.

4. The semiconductor memory device according to claim 3, wherein a width of the first conductive layer in the first direction gradually increases from a first side to a second side of the second direction, and widths of portions of the first conductive layer intersecting the semiconductor layers in the first group are smaller than widths of portions of the first conductive layer intersecting the semiconductor layers in the second group.

5. The semiconductor memory device according to claim 1, wherein a third width of the first portion of the first conductive layer in a third direction intersecting the first direction and the second direction is smaller than a fourth width of the second portion of the first conductive layer in the third direction.

6. The semiconductor memory device according to claim 1, further comprising:

a third semiconductor layer provided apart from the first semiconductor layer in a third direction intersecting the first direction and the second direction, and extending in the first direction, the first conductive layer being provided between the third semiconductor layer and the first semiconductor layer;

a third insulating layer provided between the first conductive layer and the third semiconductor layer;

a second charge storage layer provided between the first conductive layer and the third insulating layer; and a fourth insulating layer provided between the first conductive layer and the second charge storage layer.

7. A semiconductor memory device comprising:

a first semiconductor layer extending in a first direction;

a second semiconductor layer stacked above the first semiconductor layer in a second direction intersecting the first direction, the second semiconductor layer extending in the first direction;

a first conductive layer intersecting the first semiconductor layer and the second semiconductor layer and extending in the second direction;

a second conductive layer provided apart from the first conductive layer in the first direction, intersecting the first semiconductor layer and the second semiconductor layer, and extending in the second direction;

a first insulating layer provided between the first conductive layer and the first semiconductor layer;

a first charge storage layer provided between the first conductive layer and the first insulating layer; and a second insulating layer provided between the first conductive layer and the first charge storage layer, wherein a first distance between the first conductive layer and the second conductive layer at a position intersecting the first semiconductor layer is larger than a second distance between the first conductive layer and the second conductive layer at a position intersecting the second semiconductor layer, and a first thickness of the first semiconductor layer in the second direction is larger than a second thickness of the second semiconductor layer in the second direction.

8. The semiconductor memory device according to claim 7, further comprising:

a third conductive layer intersecting the first semiconductor layer and the second semiconductor layer and extending in the second direction, the first semiconductor layer and the second semiconductor layer being interposed between the third conductive layer and the first and second conductive layers.

9. The semiconductor memory device according to claim 7, further comprising:

a first group of a plurality of semiconductor layers stacked in the second direction with the first semiconductor layer, the semiconductor layers in the first group each extending in the first direction; and a second group of a plurality of semiconductor layers stacked in the second direction with the second semiconductor layer, the semiconductor layers in the second group being apart from the semiconductor layers in the first group and each extending in the first direction, wherein the first conductive layer intersects the semiconductor layers in the first group and the semiconductor layers in the second group, and the semiconductor layers in the first group have the first thickness, and the semiconductor layers in the second group have the second thickness.

10. The semiconductor memory device according to claim 9, wherein the first conductive layer includes portions intersecting the semiconductor layers in the first group and portions intersecting the semiconductor layers in the second group, the second conductive layer includes portions intersecting the semiconductor layers in the first group and portions intersecting the semiconductor layers in the second group, a distance between the first conductive layer and the second conductive layer gradually decreases from a first side to a second side of the second direction, and distances between the first conductive layer and the second conductive layer at positions intersecting the semiconductor layers in the first group are larger than distances between the first conductive layer and the second conductive layer at positions intersecting the semiconductor layers in the second group.

11. The semiconductor memory device according to claim 7, wherein the first conductive layer includes a first portion intersecting the first semiconductor layer and a second portion intersecting the second semiconductor layer, and a first width of the first portion in the first direction is smaller than a second width of the second portion in the first direction.

12. The semiconductor memory device according to claim 7, further comprising:

a third semiconductor layer provided apart from the first semiconductor layer in a third direction intersecting the first direction and the second direction, and extending in the first direction, the first conductive layer being provided between the third semiconductor layer and the first semiconductor layer;

a third insulating layer provided between the first conductive layer and the third semiconductor layer;

a second charge storage layer provided between the first conductive layer and the third insulating layer; and a fourth insulating layer provided between the first conductive layer and the second charge storage layer.

13. A semiconductor memory device comprising:
a first semiconductor layer extending in a first direction;
a second semiconductor layer stacked above the first semiconductor layer in a second direction intersecting the first direction, the second semiconductor layer extending in the first direction; and
a first conductive layer intersecting the first semiconductor layer and the second semiconductor layer and extending in the second direction, wherein
the first conductive layer includes a first portion intersecting the first semiconductor layer and a second portion intersecting the second semiconductor layer,
where a first width of the first portion in the first direction is L1, a second width of the second portion in the first direction is L2, a length of the first semiconductor layer in a third direction intersecting the first direction and the second direction is P1, and a length of the second semiconductor layer in the third direction is P2, L1/P1<L2/P2 is satisfied, and
a first thickness of the first semiconductor layer in the second direction is larger than a second thickness of the second semiconductor layer in the second direction.

14. The semiconductor memory device according to claim 13, further comprising:

a second conductive layer provided apart from the first conductive layer in the first direction, intersecting the first semiconductor layer and the second semiconductor layer, and extending in the second direction; and a third conductive layer intersecting the first semiconductor layer and the second semiconductor layer and extending in the second direction, the first semiconductor layer and the second semiconductor layer being interposed between the third conductive layer and the first and second conductive layers.

15. The semiconductor memory device according to claim 13, further comprising:

a first group of a plurality of semiconductor layers stacked in the second direction with the first semiconductor layer, the semiconductor layers in the first group each extending in the first direction; and a second group of a plurality of semiconductor layers stacked in the second direction with the second semiconductor layer, the semiconductor layers in the second group being apart from the semiconductor layers in the first group and each extending in the first direction, wherein the first conductive layer intersects the semiconductor layers in the first group and the semiconductor layers in the second group, and the semiconductor layers in the first group have the first thickness, and the semiconductor layers in the second group have the second thickness.

16. The semiconductor memory device according to claim 15, wherein a width of the first conductive layer in the first direction gradually increases from a first side to a second side of the second direction, widths in the first direction of portions of the first conductive layer intersecting the semiconductor layers in the first group are smaller than widths in the first direction of portions of the first conductive layer intersecting the semiconductor layers in the second group, lengths of the semiconductor layers in the third direction gradually decrease from the first side to the second side of the second direction, and lengths in the third direction of the semiconductor layers in the first group are larger than lengths in the third direction of the semiconductor layers in the second group.

17. The semiconductor memory device according to claim 13, further comprising:

a first insulating layer provided between the first conductive layer and the first semiconductor layer;

a first charge storage layer provided between the first conductive layer and the first insulating layer; and a second insulating layer provided between the first conductive layer and the first charge storage layer.

18. The semiconductor memory device according to claim 17, further comprising:

a third semiconductor layer provided apart from the first semiconductor layer in the third direction, and extending in the first direction, the first conductive layer being provided between the third semiconductor layer and the first semiconductor layer;

a third insulating layer provided between the first conductive layer and the third semiconductor layer;

a second charge storage layer provided between the first conductive layer and the third insulating layer; and a fourth insulating layer provided between the first conductive layer and the second charge storage layer.

\* \* \* \* \*